(12) United States Patent
Nakamura et al.

(10) Patent No.: US 7,339,256 B2
(45) Date of Patent: Mar. 4, 2008

(54) SEMICONDUCTOR DEVICE

(75) Inventors: Naofumi Nakamura, Yokohama (JP); Noriaki Matsunaga, Chigasaki (JP); Sachiyo Ito, Yokohama (JP); Masahiko Hasunuma, Yokohama (JP); Takeshi Nishioka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 10/974,922

(22) Filed: Oct. 28, 2004

(65) Prior Publication Data

US 2005/0167842 A1   Aug. 4, 2005

(30) Foreign Application Priority Data

Jan. 15, 2004   (JP) ............... 2004-008303
Jul. 1, 2004    (JP) ............... 2004-195731

(51) Int. Cl.
    H01L 29/72   (2006.01)
(52) U.S. Cl. .............. 257/659; 257/401; 257/459; 257/620; 257/700; 257/758; 257/774
(58) Field of Classification Search ........ 257/401, 257/459, 620, 659, 700, 758, 774
    See application file for complete search history.

(56) References Cited

U.S. PATENT DOCUMENTS

| | | | |
|---|---|---|---|
| 5,994,762 A | 11/1999 | Suwanai et al. | |
| 6,037,668 A * | 3/2000 | Cave et al. | 257/784 |
| 6,313,037 B1 | 11/2001 | Kajita et al. | |
| 6,563,148 B2 | 5/2003 | Kawashima et al. | |
| 2004/0113238 A1 | 6/2004 | Hasunuma | |
| 2004/0119164 A1 | 6/2004 | Kurashima et al. | |

FOREIGN PATENT DOCUMENTS

| | | |
|---|---|---|
| CN | 1534777 A | 10/2004 |
| JP | 11-307633 | 11/1999 |
| JP | 2001-267323 | 9/2001 |

OTHER PUBLICATIONS

K. Higashi, et al., "A Manufacturable Copper/Low-k SiOC/SiCN Process Technology for 90nm-node High Performance eDRAM", Proceedings of the HTC 2002, Jun. 3, 2002, pp. 15-17.

(Continued)

*Primary Examiner*—Edward Wojciechowicz
(74) *Attorney, Agent, or Firm*—Oblon, Spivak, McClelland, Maier & Neustadt, P.C.

(57) ABSTRACT

A semiconductor device includes a first insulating layer provided above a semiconductor substrate. The first insulating layer includes a layer consisting essentially of a material having a relative dielectric constant smaller than 3. The first insulating layer includes a first integral structure consisting of a plug and wiring. The upper surface of the wiring is flush with the upper surface of the first insulating layer, and the lower surface of the plug is flush with the lower surface of the first insulating layer. A region protective member is formed of a second integral structure consisting of a plug and wiring. The second integral structure extends from the upper surface of the first insulating layer to the lower surface of the first insulating layer. The region protective member surrounds one of first to n-th regions (n being a natural 2 or more) partitioned by a boundary region on a horizontal plane.

30 Claims, 21 Drawing Sheets

OTHER PUBLICATIONS

K. Higashi, et al., "Temperature dependence of wire-wire capacitance in damascene structure with low-k dielectrics", Extended Abstracts (The 47th Spring Meeting, 2000): The Japan Society of Applied Physics and Related Societies, No. 2, Mar. 28, 2000, p. 851.

* cited by examiner

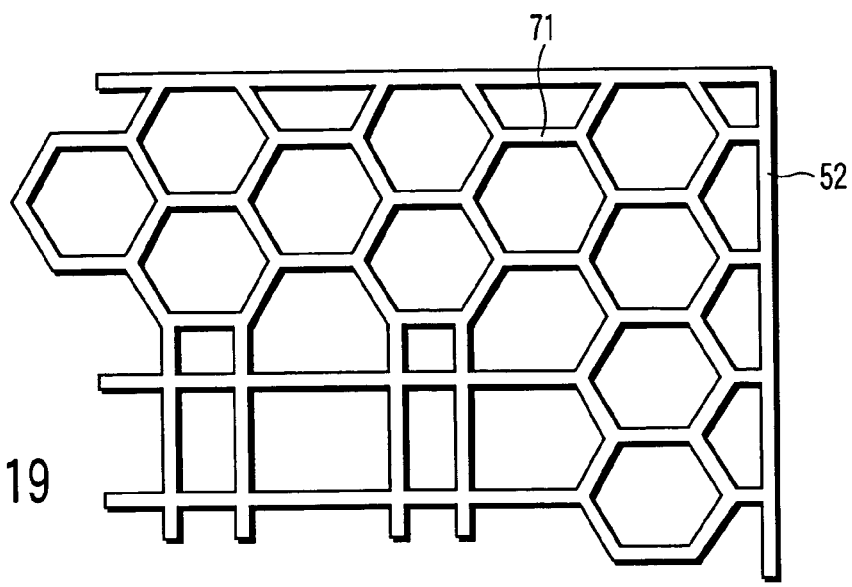
F I G. 19
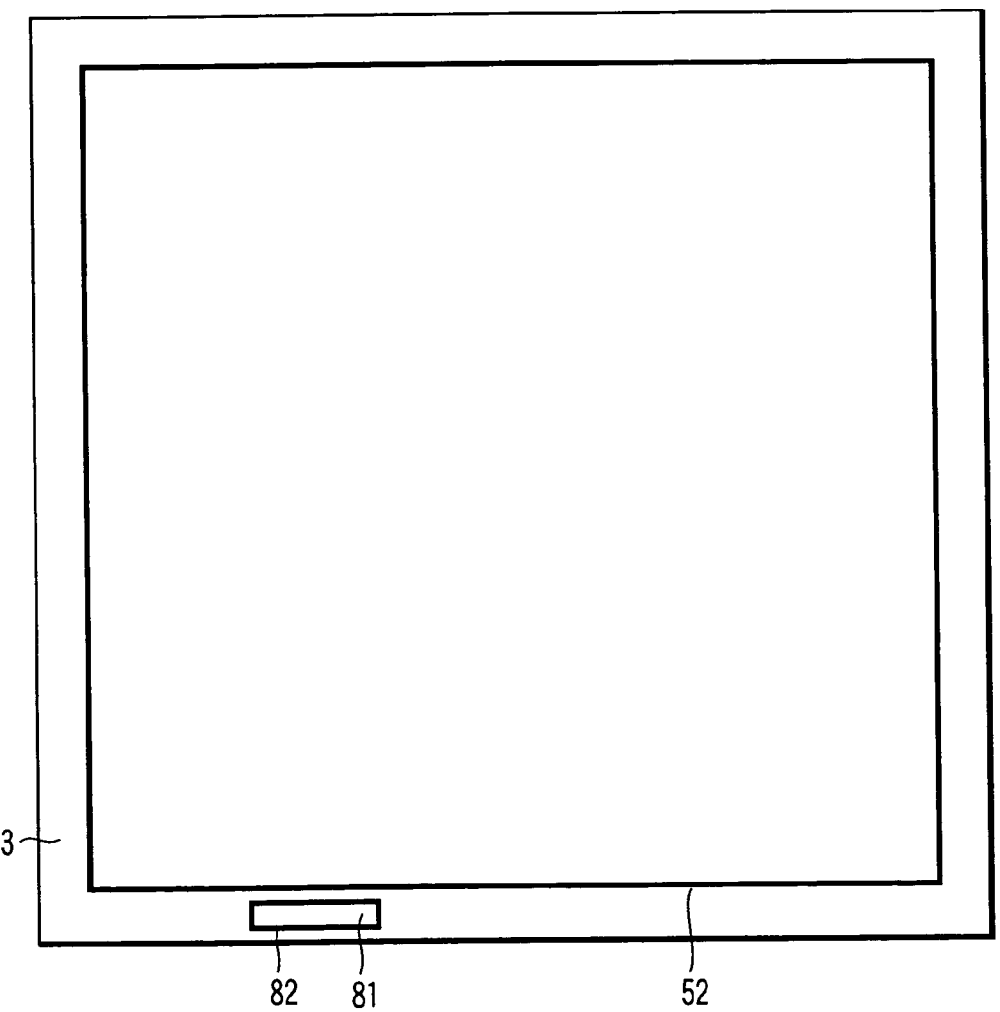
F I G. 20

|  | Dishing at CMP | Dielectric breakdown at sintering | Dielectric breakdown at bonding | TCT |
|---|---|---|---|---|
| With via fences | ○ | ○ | ○ | ○ |
| With via plugs | ○ | ○ | × | × |
| With wiring layers only | ○ | × | × | × |
| Without reinforcing wiring layers | × | × | × | × |

F I G. 40

| Coverage | Width of wiring layers | Width of via fences | Dishing at CMP | Dielectric breakdown at sintering | Dielectric breakdown at bonding | TCT |
|---|---|---|---|---|---|---|
| 10% | 0.3 μm | 0.1 μm | × | △ | × | × |
| 20% | 0.3 μm | 0.1 μm | △ | ○ | △ | △ |
| 30% | 0.3 μm | 0.1 μm | ○ | ○ | ○ | ○ |
| 40% | 0.3 μm | 0.1 μm | ○ | ○ | ○ | ○ |
| 60% | 0.3 μm | 0.1 μm | ○ | ○ | ○ | ○ |
| 80% | 0.3 μm | 0.1 μm | △ | ○ | ○ | ○ |
| 90% | 0.3 μm | 0.1 μm | × | ○ | ○ | ○ |
| 40% | 0.3 μm | 0.1 μm | ○ | ○ | ○ | ○ |
| 40% | 0.5 μm | 0.3 μm | ○ | ○ | ○ | ○ |
| 40% | 1.0 μm | 0.8 μm | ○ | ○ | ○ | ○ |
| 40% | 5.0 μm | 4.8 μm | ○ | ○ | △ | △ |
| 40% | 10 μm | 9.8 μm | △ | ○ | × | × |
| 40% | 1.0 μm | 1.0 μm | ○ | ○ | ○ | ○ |
| 40% | 1.0 μm | 0.8 μm | ○ | ○ | ○ | ○ |
| 40% | 1.0 μm | 0.5 μm | ○ | ○ | ○ | ○ |
| 40% | 1.0 μm | 0.3 μm | ○ | ○ | △ | ○ |
| 40% | 1.0 μm | 0.1 μm | ○ | ○ | × | ○ |

F I G. 41

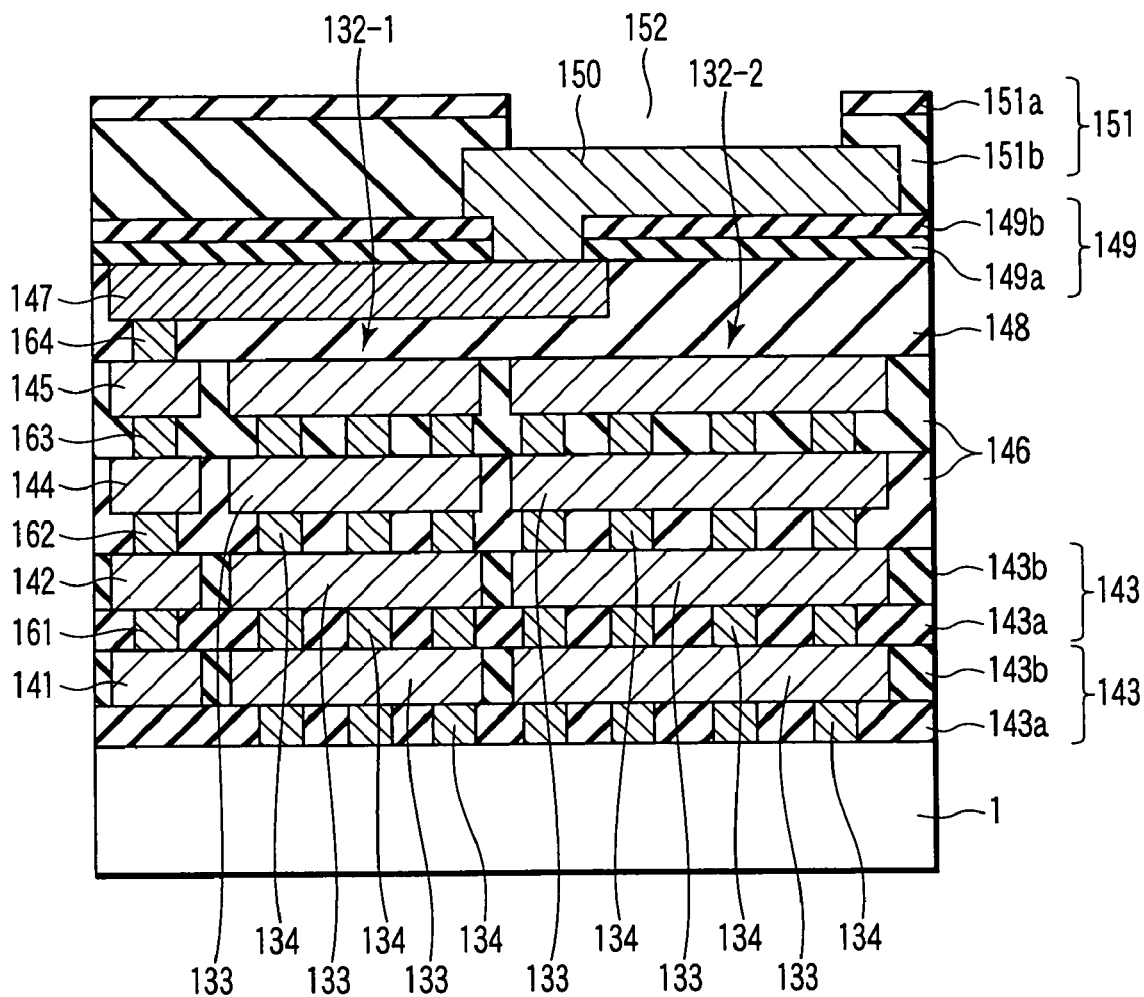
F I G. 48

SEMICONDUCTOR DEVICE

CROSS-REFERENCE TO RELATED APPLICATIONS

This application is based upon and claims the benefit of priority from the prior Japanese Patent Applications No. 2004-8303, filed Jan. 15, 2004 and No. 2004-195731, filed Jul. 1, 2004, the entire contents of both of which are incorporated herein by reference.

BACKGROUND OF THE INVENTION

1. Field of the Invention

The present invention relates to a semiconductor device, particularly, to the construction and arrangement of a dummy pattern included in a multi-layered wiring structure using, for example, a material having a low relative dielectric constant.

2. Description of the Related Art

FIG. 24 is a plan view showing a semiconductor device having the conventional multi-layered wiring structure. FIG. 25 is a sectional view taken along the line XXV-XXV shown in FIG. 24. As FIGS. 24 and 25 show, a chip ring 103, which is also referred to as a via ring, a crack stopper, a metal ring or a metal fence, is formed in a semiconductor device having a multi-layered wiring structure. The chip ring is composed of stacked structure of plugs 101 and wiring 102 and surrounds a chip. The chip ring 103 is typically formed along a dicing line (scribe line) so as to surround a device region 105. The chip ring serves to prevent the occurrence of cracks in an insulating film caused by mechanical impact in the dicing stage, peeling of the film, and permeation of water or gas into the device region from the side surface in the opening of a dicing line 104. An interlayer insulating film is formed on the dicing line 104 as well as on the device region 105. Also, an opening 106 may be formed in the interlayer insulating film on the dicing line and serve as a mark for the position alignment in, for example, the lithography process. Incidentally, a reference numeral 107 shown in FIG. 24 denotes a functional block.

Also, known is a semiconductor device in which a low dielectric constant material (low-k material) having a relative dielectric constant k smaller than 3 is used for forming the interlayer insulating film in order to decrease the capacitance between the adjacent wirings. In this semiconductor device, it is necessary to use the chip ring 103. A cap film is commonly formed on the low dielectric constant film in order to prevent the semiconductor substrate from being affected by a gas or a chemical solution in the subsequent process steps. Used is a cap film excellent in chemical resistance, of high mechanical strength, and capable of preventing gas or a chemical solution from permeating therethrough.

Sometimes, dust is mixed in the low dielectric constant film during the manufacturing process of the semiconductor device, or small cracks are generated in the low dielectric constant film during, for example, the CMP (chemical mechanical polishing) process. In such a case, a small crack grows into a large one, or the adhesion of the low dielectric constant film 108 is lowered so as to cause the low dielectric constant film 108 to be peeled off as shown in FIG. 26.

Also, if dust or small cracks are present in the low dielectric constant film, the cap film may fail to be formed as desired on each of the low dielectric constant films. In this case, the cap film tends to incur damage in the subsequent process steps. The reliability of the product semiconductor device may be lowered by the permeation of, for example, water from the upper layer of the semiconductor device through the defective portion noted above such as the damaged cap film. Note that the chip ring 103 formed to surround the device region is incapable of coping with the crack occurrence in the low dielectric constant film, with the peeling of the low dielectric constant film, and with the water permeation.

The conventional multi-layered wiring structure gives rise to another problem. In general, water or a process gas tends to be adsorbed on or accumulated in the low dielectric constant film during the manufacturing process of the semiconductor device. The water and the gas bring about problems in the subsequent process steps. For example, the low dielectric constant film may be peeled off. Also, the low dielectric constant film cannot be formed and processed as desired. Further, a good resolution of the pattern cannot be obtained in the low dielectric constant film. In general, the gas undesirably accumulated in the low dielectric constant film is released to the outside through contact holes. Therefore, the gas is not dissipated sufficiently in the portion where the plug density is low, i.e., in the low dielectric constant film with few openings. Problems attributed to the gas are highly likely to arise in this area.

A problem similar to that described above is also generated in the low dielectric constant film 108a in the dicing line 104 during the manufacturing process when water or a process gas permeates from the opening 106 as a mark and enters the low dielectric constant film 108a as shown in FIG. 27. It is conceivable to prevent the diffusion of the water and the gas by inserting a metal film into a region right below the opening 106 as a mark. However, the metal film may be etched because the metal film differs from the insulating film surrounding the metal film in the etching rate. As a result, metal atoms may migrate into the adjacent low dielectric constant film 108, or the accuracy in the position alignment may decrease.

BRIEF SUMMARY OF THE INVENTION

According to a first aspect of the present invention, there is provided a semiconductor device comprising: a semiconductor substrate; a first insulating layer provided above the semiconductor substrate and including a layer consisting essentially of a material having a relative dielectric constant smaller than 3, the first insulating layer including a first integral structure consisting of a plug and a wiring, an upper surface of the wiring being flush with an upper surface of the first insulating layer, a lower surface of the plug being flush with a lower surface of the first insulating layer; and a region protective member formed of a second integral structure consisting of a plug and a wiring, the second integral structure extending from the upper surface of the first insulating layer to the lower surface of the first insulating layer, the region protective member surrounding any one of first to n-th regions (n being a natural 2 or more) partitioned by a boundary region on a horizontal plane.

According to a second aspect of the present invention, there is provided a semiconductor device comprising: a semiconductor substrate; a first insulating layer provided above the semiconductor substrate and including a layer consisting essentially of a material having a relative dielectric constant smaller than 3, the first insulating layer including an integral structure consisting of a plug and a wiring, an upper surface of the wiring being flush with an upper surface of the first insulating layer, a lower surface of the plug being flush with a lower surface of the first insulating layer; a second insulating layer provided on the first insulating layer; an opening extending from an upper surface of the second insulating layer to a lower surface of the second insulating layer; and a protective member formed of an integral structure extending from the upper surface of the first insulating layer to the lower surface of the first insulating layer and consisting of a plug and a wiring, the protective member surrounding the opening on a horizontal plane.

According to a third aspect of the present invention, there is provided a semiconductor device comprising: a semiconductor substrate having a main surface; a first insulating layer provided above the main surface and including a layer consisting essentially of a material having relative dielectric constant smaller than 3; a first wiring layer and a first plug which are provided in the first insulating layer; an element protecting member provided in the first insulating layer, having a dummy wiring and a dummy plug which are stacked, the element protecting member surrounding a chip region in a first surface that extends along the main surface; and a first reinforcing member provided in the first insulating layer and having a first reinforcing wiring layer, a first reinforcing via fence and a second reinforcing wiring layer, the first reinforcing via fence having a short side and a long side, the long side being at least twice as long as the short side in the first surface, the first reinforcing via fence extending in the first surface along and over the first reinforcing wiring layer, the second reinforcing wiring layer extending in the first surface along and over the first reinforcing via fence.

BRIEF DESCRIPTION OF THE SEVERAL VIEWS OF THE DRAWING

FIG. 4 is a plan view schematically showing the construction of a part of a semiconductor device according to a second embodiment of the present invention;

FIG. 5 is a plan view schematically showing the construction of a part of the semiconductor device according to the second embodiment;

FIG. 7 is a plan view schematically showing the construction of a part of another example of a semiconductor device according to the second embodiment;

FIG. 8 is a plan view schematically showing the construction of a part of a semiconductor device according to a third embodiment of the present invention;

FIGS. 16, 17, 18 and 19 are plan views each showing a modification of the sixth embodiment;

FIG. 20 is a plan view schematically showing the construction of a semiconductor device according to a seventh embodiment of the present invention;

FIG. 40 is a diagram representing the advantage attained in the eighth embodiment by the use of the reinforcing member;

FIG. 41 is a diagram representing the advantage of a semiconductor device according to a ninth embodiment of the present invention;

FIGS. 48 and 49 are sectional views showing a modification of the tenth embodiment.

DETAILED DESCRIPTION OF THE INVENTION

Figure 1:
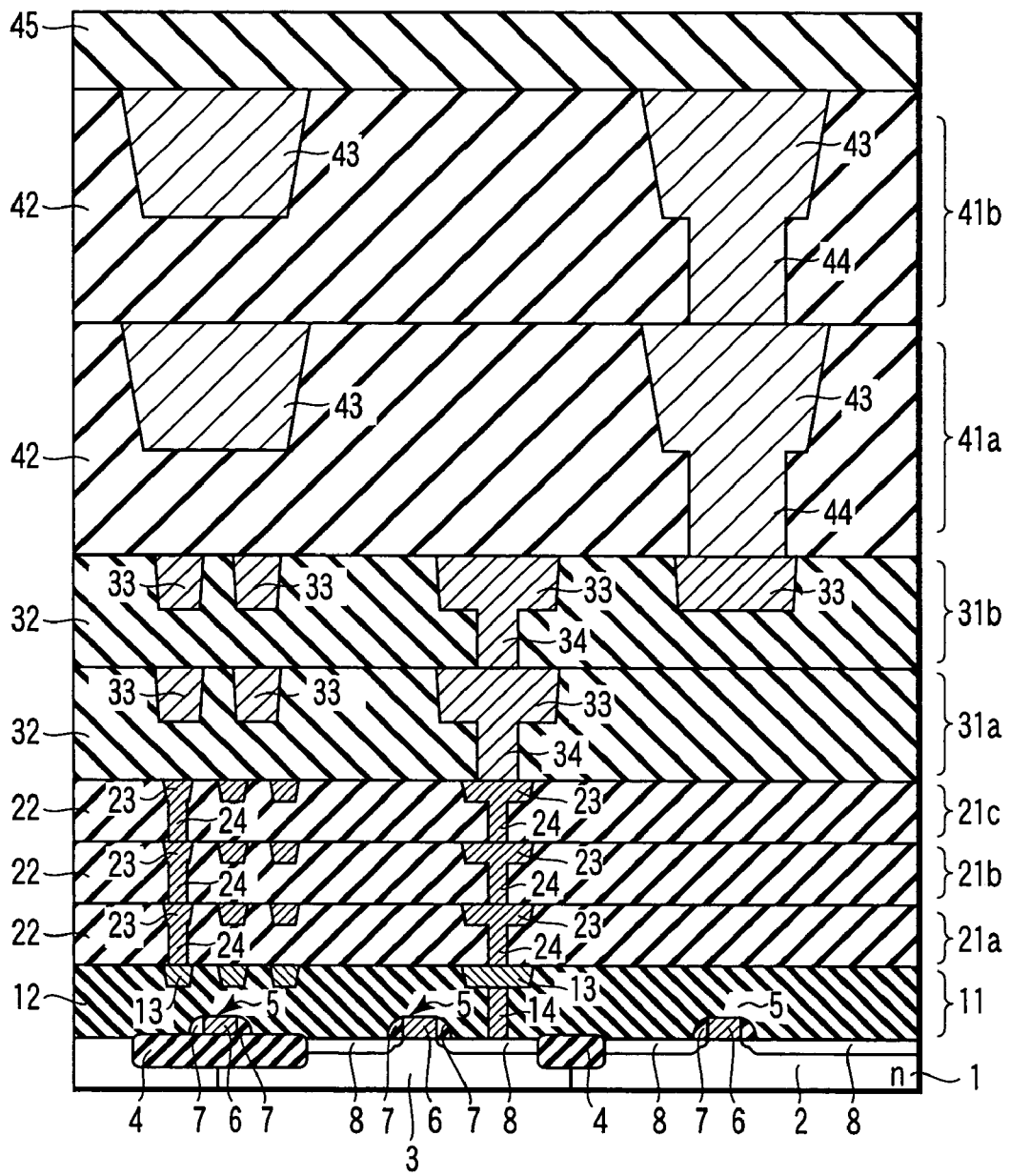
FIG. 1 is a sectional view schematically showing the typical construction of a semiconductor device having a multi-layered wiring structure.

Some embodiments of the present invention will now be described with reference to the accompanying drawings. Throughout the accompanying drawings, the constituting factors having substantially the same function and construction are denoted by the same reference numerals so as to avoid an overlapping description.

The multi-layered wiring structure of a semiconductor device will now be described with reference to a typical example prior to description of the embodiments of the present invention. FIG. 1 is a sectional view schematically showing the construction of a typical example of a semiconductor device having the multi-layered wiring structure. As shown in FIG. 1, an n-well 2 and a p-well 3 are formed in a semiconductor substrate 1. An element separating insulating film 4 is formed at the boundary between the n-well 2 and the p-well 3 on the surface of the semiconductor substrate 1.

MOS (metal oxide semiconductor) transistors 5 are formed on the surface of the semiconductor substrate 1 and on the element separating insulating film 5. Each of the MOS transistors 5 includes a gate electrode 6, a side wall insulating film 7, and source/drain diffusion layers 8.

A plurality of wiring levels are laminated one upon the other on the semiconductor substrate 1. Incidentally, a single wiring level denotes the region between the lower surface and the upper surface of a wiring/plug structure consisting of a single plug and a single wiring layer laminated on the plug. In the case of a dual damascene structure, the wiring/plug structure is formed integral.

An interlayer insulating film 12, a wiring layer 13, and plug 14s are formed within a local wiring level 11 formed on the semiconductor substrate 1. Each of the wiring layer 13 and the plugs 14 consists of a conductive material such as W (tungsten), Cu (copper), Ag (silver), or Al (aluminum). The plug 14 extends through the lower portion of the interlayer insulating film 12 so as to electrically connect the wiring layer 13 to the source/drain diffusion layers 8.

An intermediate wiring level is positioned on the local wiring level 11. The intermediate wiring level is formed of an optional number of levels. FIG. 1 exemplifies the case where three intermediate wiring levels 21a, 21b and 21c are provided. Each of the intermediate wiring levels 21a, 21b and 21c includes an interlayer insulating film 22, a wiring layer 23 and plugs 24. The interlayer insulating film 22 may be constructed in various fashions as shown in FIGS. 28 to 33.

As shown in FIGS. 28 to 33, the interlayer insulating film occupying a single wiring level can be formed of an optional number of layers and includes at least one insulating film 201 having a relative dielectric constant k smaller than 3.

In FIGS. 28 to 33, the insulating film 201 may be formed of, for example, a polyarylene hydrocarbon, methyl siloxane, an organic polymer, or SiOC. Insulating films 201 and 201', which consists of different materials, are used in the structures shown in FIGS. 31 to 33. For example, the insulating film 201 consists of an organic polymer, and the insulating film 201' consists of siloxane. A diffusion preventing film (stopper film) 202, which prevents the diffusion of the metal atoms contained in the wiring layer 23 and the plug 24, consists of, for example, SiC, SiCH, SiOC, SiOCH, SiCH, or SiN. A cap film 203 consists of, for example, SiO$_2$, SiOC or SiOCH. Further, an etching stopper film 204 consists of, for example, SiO$_2$, SiC, SiCN, SiN, SiOC or SiOCH.

The etching stopper film 204 acts as a stopper in etching the wiring trench. Needless to say, the constructions shown in FIGS. 28 to 33 are no more than examples, and the interlayer insulating film can assume other laminate structures. Also, a barrier metal layer 205 may be formed to surround the wiring layer 23 and the plug 24. The barrier metal layer 205 may consist of, for example, a metal having a high melting point such as Ti (titanium), Ta (tantalum), Nb (niobium) or W (tungsten), or a nitride of a high melting point metal.

Each of the plugs 24 extends through each of the interlayer insulating films 22 so as to connect electrically a wiring layer 33 to the wiring layer 13 or 23 in the interlayer insulating film 12 or 22 below the wiring layer 33.

A semi-global wiring level is positioned on the intermediate wiring level 21c. The semi-global wiring level is formed of an optional number of levels. FIG. 1 shows an example in which two semi-global wiring levels 31a, 31b are provided. Each of the semi-global wiring levels 31a and 31b includes an interlayer insulating film 32, a wiring layer 33, and plugs 34. The interlayer insulating film 32 may have various constructions as shown in FIGS. 28 to 33 and to include a film having a relative dielectric constant larger than that of the film included in the constructions shown in FIGS. 28 to 33. The wiring layer 33 and the plugs 34 consist of the materials similar to those of the wiring layers 13 and the plugs 14, respectively. Each of the plugs 34 extends through each of the interlayer insulating films 32 so as to connect electrically the wiring layer 33 to the wiring layer 23 or 33 in the interlayer insulating film 22 or 32 below the interlayer insulating film 32. Also, the plug 34 has a cross-sectional area larger than that of the plug 24 in the intermediate wiring levels 21a to 21c.

A global wiring level is positioned on the semi-global wiring level 31b. The global wiring level is formed of an optional number of levels. FIG. 1 shows an example in which two global wiring levels 41a and 41b are provided. Each of the global wiring levels 41a and 41b includes an interlayer insulating film 42, a wiring layer 43, and plugs 44. Each of the interlayer insulating films 42 is formed mainly of a material having a relative dielectric constant k not smaller than 3 and smaller than 4. Alternatively, the interlayer insulating film 42 may be of a laminate structure including at least one film having such a relative dielectric constant k as noted above. The wiring layer 43 and the plugs 44 consist of the materials similar to those of the wiring layer 33 and the plug 34, respectively. Each of the plugs 44 extends through each of the interlayer insulating films 42 so as to connect electrically the wiring layer 43 to the wiring layer 33 or 43 in the interlayer insulating film 32 or 42. Also, the plug 44 has a cross-sectional area larger than that of the plug 34 in the semi-global wiring levels 31a and 31b.

A protective insulating film 45 is formed on the global wiring level 41b. As in FIGS. 28 to 33, a barrier metal layer may be formed in the local wiring level, the semi-global wiring level and the global wiring level. Incidentally, the usage of each layer described above is no more than an example and does not limit the manner of use of the layers ranging between the local wiring level and the global wiring level.

Each embodiment of the present invention that can be applied in the optional level of the semiconductor device shown in FIG. 1 will now be described.

First Embodiment

Figure 2:
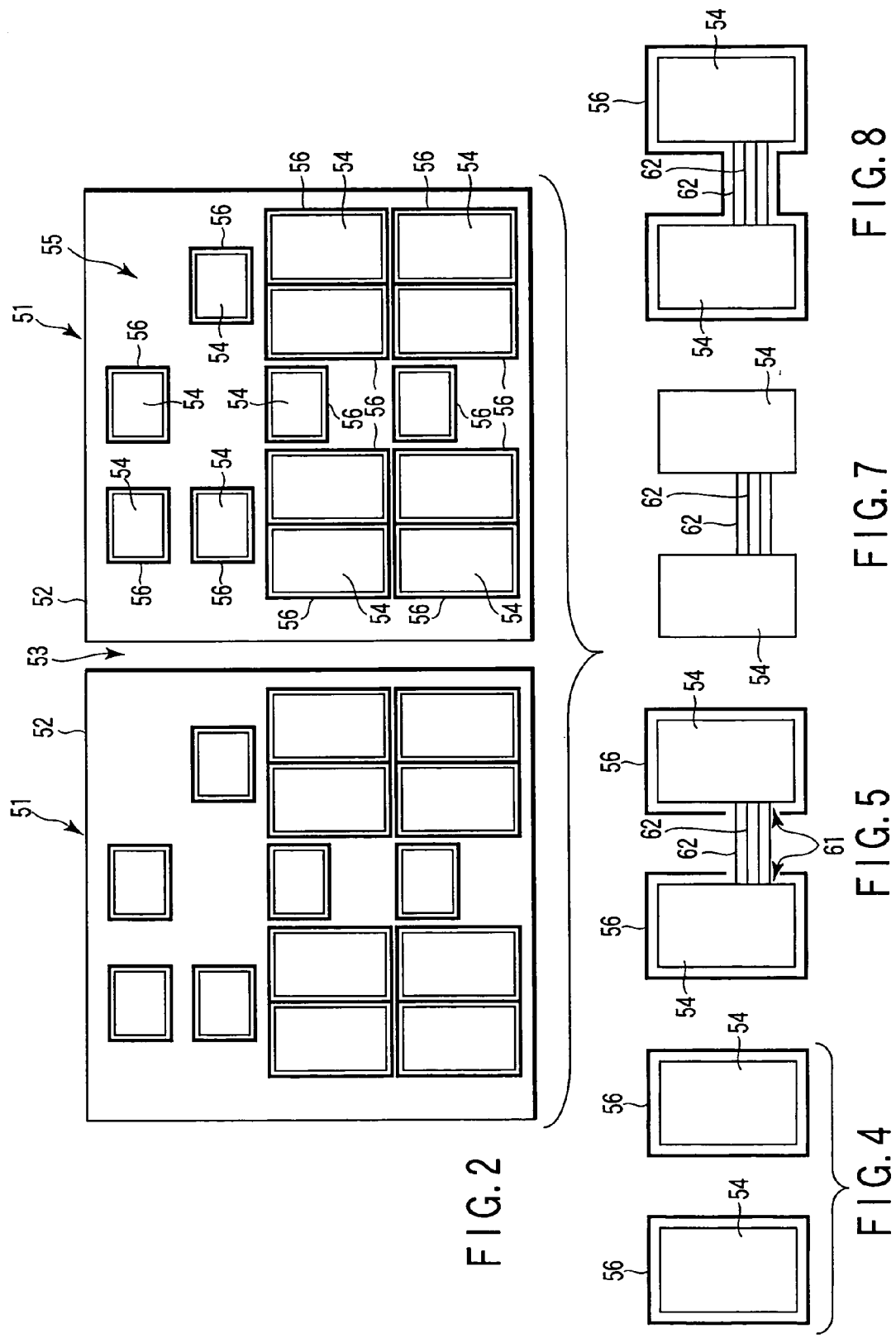
FIG. 2 is a plan view schematically showing the construction of a semiconductor device according to a first embodiment of the present invention.

FIG. 2 is a plan view schematically showing the construction of a semiconductor device according to a first embodiment of the present invention. As shown in FIG. 2, semiconductor chips 51 (two are shown as an example) are formed on a main surface of the semiconductor substrate 1. Each of the semiconductor chips 51 is surrounded by a fence (chip ring) 52 (element protective member). To be more specific, the fence 52 extends on a plane (horizontal plane)

parallel to the main surface of the semiconductor substrate 1 so as to surround continuously the device region (element region) corresponding to the semiconductor chip 51. Also, a dicing line (dicing region) 53 is formed around the semiconductor chip 51.

Functional circuit blocks 54 are formed within the semiconductor chip 51. Each of the functional circuit blocks 54 performs a properly independent function and corresponds to, for example, the macro (core) of the system LSI (Large Scale Integrated circuit). A boundary region (no-element region) 55 is present between the adjacent functional circuit blocks 54. No wiring layer and no plug is formed in the boundary region 55.

A fence 56 acting (region protective member) continuously surrounds the functional circuit block 54. To be more specific, the fence 56 extends on a plane parallel to the main surface of the semiconductor substrate 1 so as to surround a region (functional region) corresponding to each of the functional circuit blocks 54. In other words, each of the functional circuit blocks 54 is formed only within the region surrounded by the fence 56.

Figure 34:
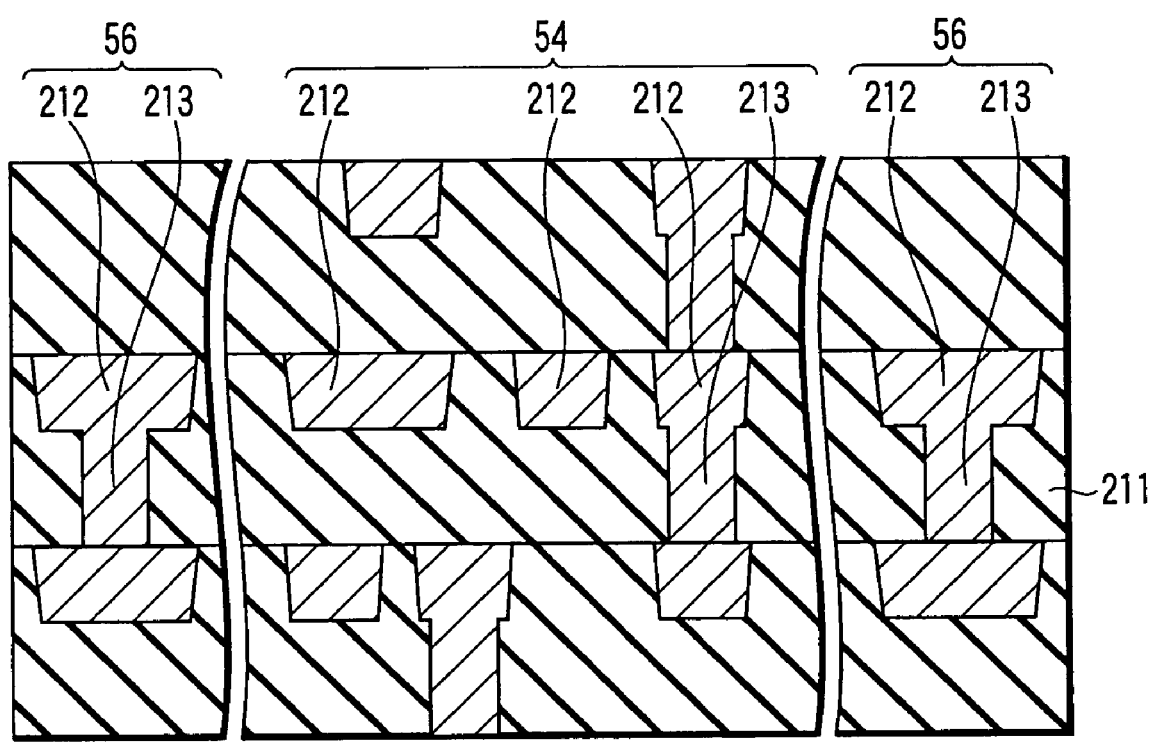
FIG. 34 is a sectional view schematically showing the construction of a fence.

FIG. 34 schematically shows the sectional construction of the fence 56. The fence 56 can be formed for at least one optional level shown in FIG. 1. As shown in FIG. 34, the fence 56 surrounds wiring layers 212 and plugs 213 constituting a functional circuit block 54 in a wiring level 211. The fence 56 is formed of a laminate structure consisting of the wiring layer 212 and the plug 213 within the wiring level 211. The fence 56 of the particular construction is arranged to surround at least a single optional functional circuit block 54 in a certain wiring level. It is also possible for the fence 56 to be formed to extend over a plurality of wiring levels.

Figure 3:
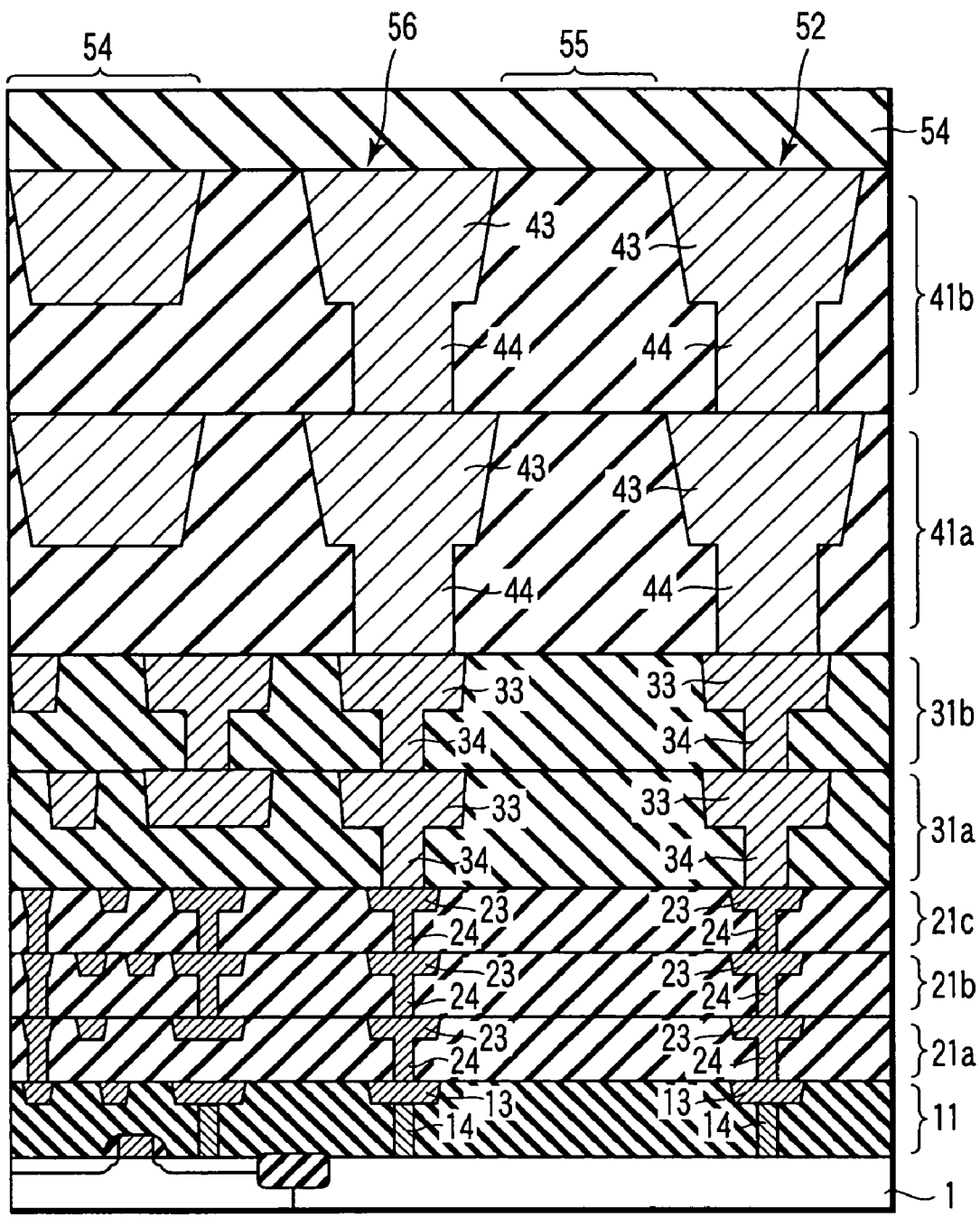
FIG. 3 is a sectional view schematically showing the construction of a fence.

It is also possible for the fence 56 to be formed to extend over the entire wiring levels. FIG. 3 schematically shows the sectional constructions of the fences 52 and 56. The drawing is directed to an example that the fence 52 extends over the entire wiring levels 11, 21a to 21c, 31a to 31c, 41a and 41b. As shown in FIG. 3, each of the fences 52 and 56 are is formed of the plugs 14, 24, 34, 44 and the wiring layers 13, 23, 33, 43 extend in a direction forming an angle with the main surface of the substrate (typically in a direction perpendicular to the main surface of the substrate) over the region ranging between the local wiring level 11 and the global wiring level 41b. It is desirable that potential of the fences 52 and 56 are fixed, typically at the ground potential, so as to avoid the potential of the fences 52 and 56 to float.

Only a single column of the fence 52 is shown in FIG. 3. However, two fences 52 or more in parallel are provided. This can produce the effect described herein later even if a fence 52 has been broken. This applies to the fence 56. These description also apply to embodiments described herein later.

A large amount of water and a gas are less likely to permeate in general into the interlayer insulating film in a material having a relative dielectric constant k not smaller than 3 (herein after referred to as non low-k material) as described above. Therefore, the problem is not so serious as in a material having a relative dielectric constant k smaller than 3. It follows that it is not necessary to form the fence 56 within the interlayer insulating film consisting of a non low-k material. However, it is advantageous to form the fence 56 also within the interlayer insulating film consisting of a non low-k material because some materials are relatively easy to absorb water and gas and the fence 56 can increase the mechanical strength in the CMP stage in which the fence 56 is provided.

A dummy pattern (not shown) may be formed in the interlayer insulating films 12, 22, 32 and 42 within the no-element region 55. The dummy pattern disperses or equalizes the load applied to the interlayer insulating film to which the CMP treatment is applied.

In the semiconductor device according to the first embodiment, the functional circuit blocks 54 within the semiconductor chip 51 is surrounded by the fence 56 in at least one of the interlayer insulating films 12, 22, 32 each including at least a low-k material. In other words, the functional circuit block 54 is formed only within the region surrounded by the fence 56. Therefore, it is possible to prevent the cracks and scratches formed within the interlayer insulating films 12, 22, 32 from propagating over the fence 56 during the manufacturing process. So, even if cracks and scratches are generated within the no-element region 55, these cracks and scratches are prevented from expanding into the functional circuit block 54.

Also, according to the first embodiment, the fence 56 prevents water and the process gas from entering the region separated by the fence 56 from an aperture formed by unintentionally peeled off interlayer insulating films 12, 22, and 32 during the manufacturing process. Further, the water and the gas transmitted within the low-k material film, into which water and gas originally tend to permeate easily, are prevented from entering the functional circuit block 54. It follows that the reliability of the semiconductor device can be improved.

Incidentally, the lowermost layer and the uppermost layer of the interlayer insulating films in which the fence 56 is formed may consist of a material having a film density not lower than 2. For example, the two layer correspond the interlayer insulating film 12, 32 when the fence 56 extends from the local wiring level 11 to the semi-global wiring level 31b in the structure shown in FIG. 1. Also, SiO, SiOC, SiOCN, SiN, SiCN, SiON, and SiONH or a laminate structure of any of them can be used as a material having a film density not lower than 2. When this construction is employed, it is possible to prevent the permeation of water and gas also from the upper and lower portions of the region surrounded by the fence 56.

Second Embodiment

A second embodiment is employed in combination with the first embodiment. In the second embodiment, the fence 56 is partly discontinuous in the wiring level of a high layer. Alternatively, the fence 56 is not formed in the high layer.

FIGS. 4 and 5 are plan views each showing schematically the construction of a part of a semiconductor device according to the second embodiment of the present invention. As shown in FIGS. 4 and 5, the semiconductor device comprises, for example, substantially three wiring levels. To be more specific, a second wiring level and a third wiring level are formed successively on a first wiring level constituting the lowermost wiring level. The interlayer insulating film in each of the first and second wiring levels consists of a low-k material. On the other hand, the interlayer insulating film in the third wiring level consists of a non low-k material. It is possible to form the first to third wiring levels as respective first to third wiring level groups composed of two or more wiring level. In the multi-layered wiring structure shown in FIG. 1, the first and second wiring levels correspond to the levels ranging between the local wiring level 11 and the semi-global wiring levels 31a and 31b shown in FIG. 1, and the third wiring level corresponds to the global wiring levels 41a, 41b shown in FIG. 1.

In the first and second wiring levels, the fence 56 is closed, and the fence 56 continuously surrounds the functional circuit block 54. On the other hand, the fence 56 is not closed and is discontinuous so as to form an opening 61 in the third wiring level. A block connecting wiring 62, which is electrically connected to the functional circuit block 54, extends from the opening 61 to the outside. The wiring layer 62 electrically connects functional circuit blocks 54 each other. Where the third wiring level corresponds to the global wiring levels 41a, 41b shown in FIG. 1, the block connecting wiring 62 corresponds to the wiring layer 43 shown in FIG. 1.

Figure 6:
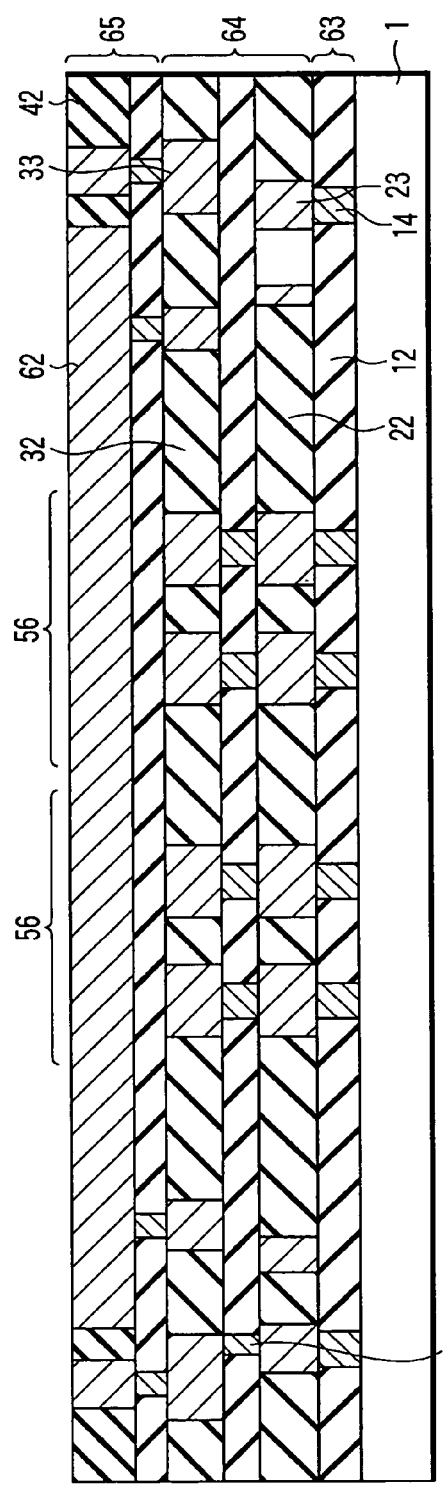
FIG. 6 is a sectional view schematically showing the construction of the semiconductor device according to the second embodiment.

FIG. 6 is a sectional view showing the construction shown in FIGS. 4 and 5. As shown in FIG. 6, the functional circuit blocks for the first wiring level 63 and the second wiring level 64 are electrically connected to each other in the third wiring level 65.

Also, it is possible for the fence 56 not to be formed at all in the third wiring level as shown in FIG. 7. The fences 56 for the first and second wiring levels 63, 64 are closed in this case, too.

In the semiconductor device according to the second embodiment, the fence 56 surrounds the functional circuit block 54 in the first and second wiring levels 63, 64 in which the interlayer insulating film consists of a low-k material. Therefore, it is possible to obtain the same effect as in the first embodiment.

Further according to the second embodiment, the fence 56 is not closed so as to form the opening 61 in the third wiring level 65 in which the interlayer insulating film consists of a non low-k material. The functional circuit blocks 54 in the third wiring level 65 are electrically connected to each other by the block connecting wiring 62, the wiring 62 extending from the opening 61 to the outside. So, it is possible to connect electrically the functional circuit blocks 54 in the first wiring level 63 and the second wiring level 64 to each other via the third wiring level 65.

Third Embodiment

A third embodiment is an application of the second embodiment. In the third embodiment, the fence 56 also surrounds the block connecting wiring 62.

FIG. 8 is a plan view schematically showing the construction of a semiconductor device according to the third embodiment. As shown in FIG. 8, the fence 56 continuously surrounds collectively the functional circuit blocks 54 connected to each other by the wiring 62 and the block connecting wiring 62 in the third wiring level. The constructions of the first wiring level 63 and the second wiring level 64 remain unchanged from the second embodiment.

In the semiconductor device according to the third embodiment, it is possible to obtain the same effect as in the second embodiment. Further, the fence 56 does not have an opening, so as to form a closed structure in the third wiring level 65. Therefore, the water and the gas permeating into the interlayer insulating film of the third wiring level 65 can be it is possible to prevent the water and the gas permeating into the interlayer insulating film of the third wiring level 65 from entering the functional circuit block 54 of the same layer.

Fourth Embodiment

In the first embodiment, the position of the fence 56 is determined in accordance with the position of the functional circuit block 54. In a fourth embodiment, the functional circuit block 54 is formed within a region partitioned in advance by the fence 56.

Figure 9:
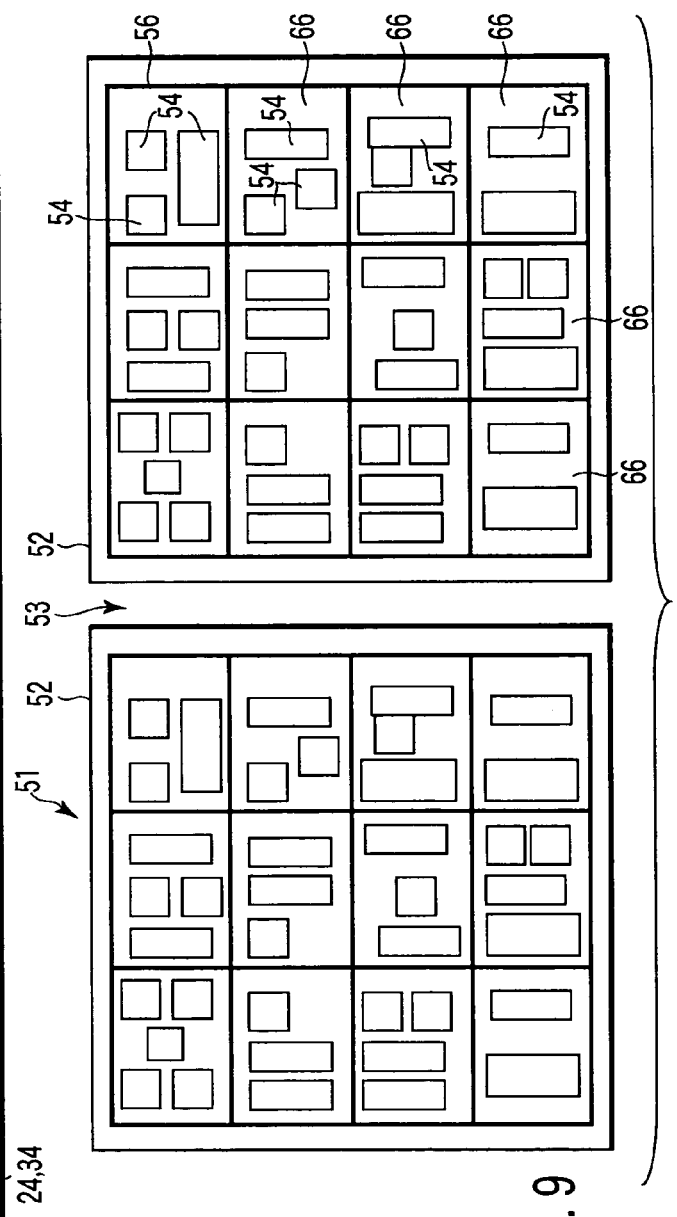
FIG. 9 is a plan view schematically showing the construction of a part of a semiconductor device according to a fourth embodiment of the present invention.

FIG. 9 is a plan view schematically showing the construction of a part of a semiconductor device according to the fourth embodiment. As shown in FIG. 9, the region surrounded by the fence 56 is further surrounded by the fence 52. In other words, the region surrounded by the fence 52 is partitioned into a plurality of small blocks 66 by the fence 56. One functional circuit block 54 or more is formed in each small block 66. The functional circuit blocks 54 are electrically connected to each other by combining the second ore third embodiment. In FIG. 9, the fence 56 forms a lattice. However, the arrangement of the fence 56 is not particularly limited as long as the fence 56 forms small blocks 66 each having a suitable size. The remaining parts stay unchanged from the first to third embodiments.

In the semiconductor device according to the fourth embodiment, the region surrounded by the fence 52 is partitioned into the small blocks 66 and then functional circuit blocks 54 are formed in the blocks 66. This brings about the same effect as in the first embodiment. Further, the fence 56 can be formed easily in the fourth embodiment, compared with the first embodiment in which the fence 56 is formed selectively in the region of the interlayer insulating films 12, 22, 32 in which the wiring layers 13, 23, 33, 43 and the plugs 14, 24, 34, 44 are not formed.

Fifth Embodiment

In the first to fourth embodiments, the fence. 56 surrounds the entire functional circuit block 54. In a fifth embodiment, the fence 56 surrounds the wiring layers 13, 23, 33 and 43.

Figure 10:
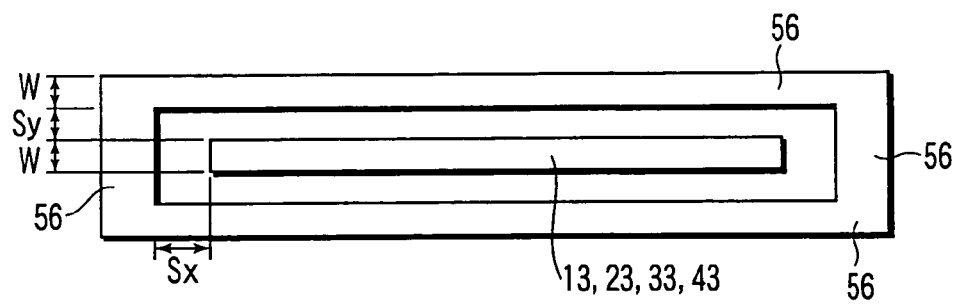
FIG. 10 is a plan view schematically showing the construction of a part of a semiconductor device according to a fifth embodiment of the present invention.

FIG. 10 is a plan view schematically showing the construction of a part of a semiconductor device according to the fifth embodiment. As shown in FIG. 10, the fence 56 surrounds the wiring layer 13. The wiring layer 13 is taken up in the following description as a representative. The description, however, applies to other wiring layers 23, 33 and 43 similarly.

Where the wiring layer 13 has a width W, the distance Sy between the wiring layer 13 and the fence 56 in the width direction of the wiring layer 13 is equal to the width W. Also, the distance Sx between the wiring layer 13 and the fence 56 in the longitudinal direction of the wiring layer 13 is equal to the width W.

Figure 11:
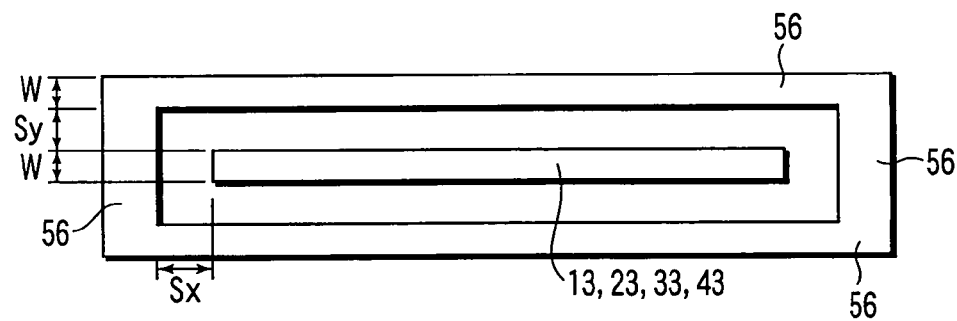
FIG. 11 is a plan view schematically showing the construction of a part of the semiconductor device according to the fifth embodiment.

As another example of the relationship among the width W and the distances Sx, Sy, it is possible to make the distance Sy larger than the distance Sx, as shown in FIG. 11. If the distance between the wiring layer 13 and the fence 56 is small, the parasitic capacitance therebetween is increased. The parasitic capacitance also increases if the mutually facing areas of the wiring layer 13 and the fence 56 are large. Such being the situation, the distance between the fence 56 and the wiring layer 13 is increased in the portion where the wiring layer 13 and the fence 56 face each other over a long distance, i.e., the portion where the fence 56 faces the long side of the wiring layer 13. In this way, it is possible to suppress the parasitic capacitance between the fence 56 and the wiring layer 13. The electrical connection between the different wiring layers 13 can be achieved by the combination of the second or third embodiment.

In the semiconductor device according to the fifth embodiment, the fence 56 surrounds the wiring layers 13, 23, 33 and 43. This brings about the same effect as in the first embodiment in the unit of the wiring layers 13, 23, 33 and 43. Also, it is possible to limit the propagation of the scratches and the peeling of the film generated in the interlayer insulating films 12, 22, 32, 42 or the diffusion of water and gas to a small range.

Also, according to another example of the fifth embodiment, the distance Sy between the fence 56 and the wiring layer 13, 23, 33, or 44 in the portion where the fence 56 faces the long side of the wiring layer 13, 23, 33 or 43 is larger than the distance between the fence 56 and the wiring layer 13, 23, 33, or 44 in the portion where the fence 56 faces the short side of the wiring layer 13, 23, 33 or 43. Therefore, it is possible to suppress the parasitic capacitance between the fence 56 and the wiring layer 13, 23, 33 or 44 to a small value.

Sixth Embodiment

A sixth embodiment is employed in combination with the first embodiment. In the sixth embodiment, a fence formed like the fence 56 is formed in a mesh form in the no-element region 55.

Figure 12:
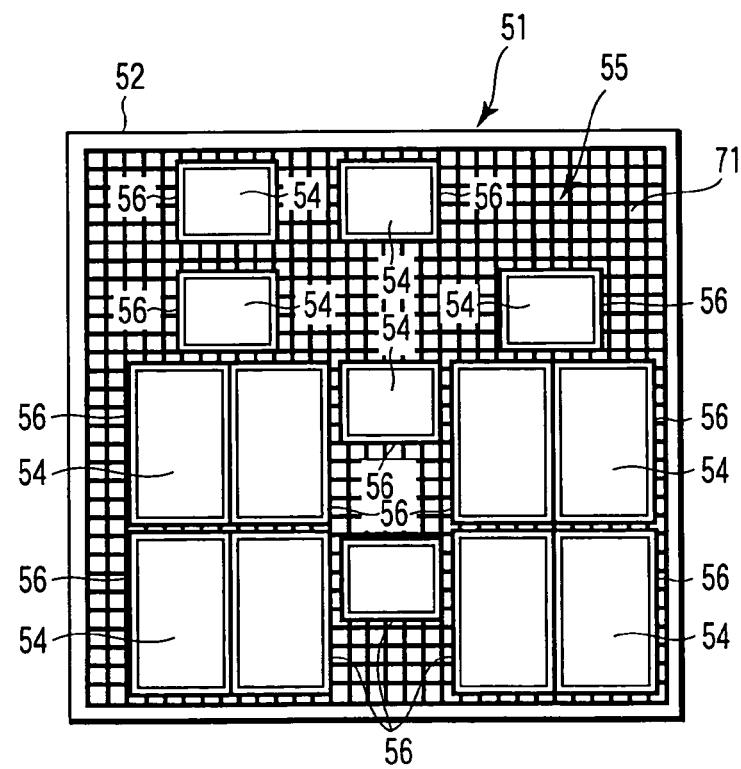
FIG. 12 is a plan view schematically showing the construction of a semiconductor device according to a sixth embodiment of the present invention.

FIG. 12 is a plan view schematically showing the construction of a semiconductor device according to the sixth embodiment of the present invention. As shown in FIG. 12, a fence (dummy pattern) 71 is formed in the no-element region 55 within the device region in addition to the construction according to the first embodiment. As exemplified in FIG. 12, the fence 71 is formed to extend in the vertical and lateral directions so as to form a mesh shape. Therefore, the no-element region 55 is partitioned by the fence 71 into small regions. The mesh can be shaped like, for example, a lattice. The fence 71 may be formed on the entire region 55 or in only a part of the no-element region 55.

Figure 13:
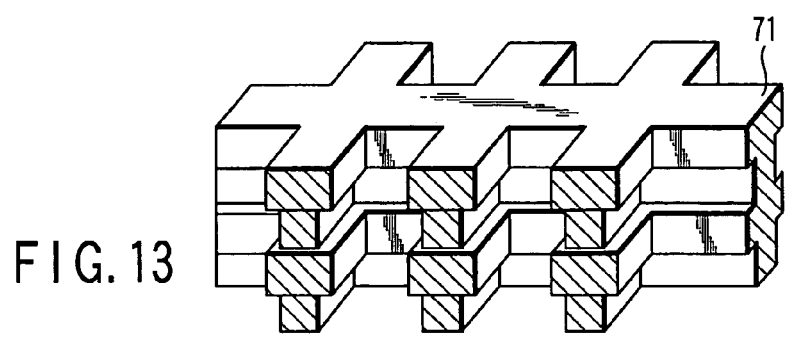
FIG. 13 is a perspective view showing the construction of a part of the semiconductor device shown in FIG. 12.

FIG. 13 is a perspective view showing the construction of the fence 71 shaped like a lattice as an example. As shown in FIG. 13, the fence 71 is constructed such that the wiring layers 13, 23, 33, 43 and the plugs 14, 24, 34, 44 are laminated one upon the other like the fences 52 and 56. It is desirable that potential of the fence 71 are fixed like the fences 52, 56.

Figure 14:
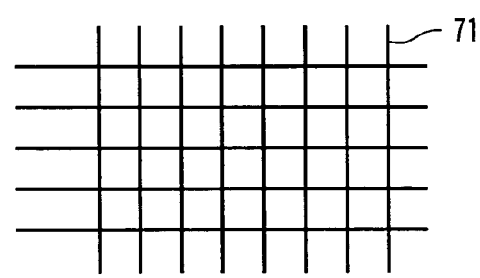
FIG. 14 is a plan view showing the construction of a part of the semiconductor device according to the sixth embodiment.
Figure 15:
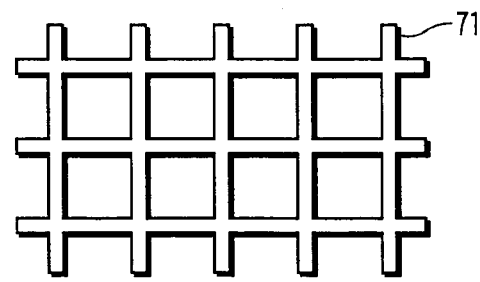
FIG. 15 is a plan view showing the construction of a part of the semiconductor device according to the sixth embodiment.

FIG. 14 is a plan schematically showing the construction of the fence 71 in the lower layer (e.g., the local wiring level 11 or the intermediate wiring levels 21a to 21c). FIG. 15 is a plan view schematically showing the construction of the fence 71 in the upper layer (e.g., the semi-global wiring levels 31a, 31b or the global wiring levels 41a, 41b). As described previously, the width of the wiring layer is increased with elevation of the wiring level. Therefore, that the fence 71 in the lower layer has a fine mesh, as shown in FIG. 14. To be more specific, the line forming the mesh is fine, and the region surrounded by the fine lines has a small area. On the other hand, the fence in the upper layer has a coarse mesh. In other words, the line forming the mesh is thick, and the region surrounded by the thick lines has a large area.

Figure 16:
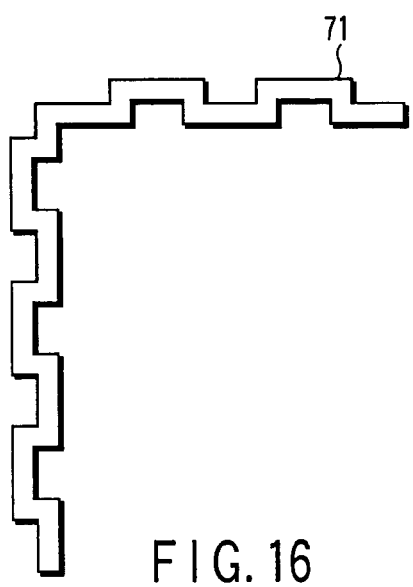
Figure 17:
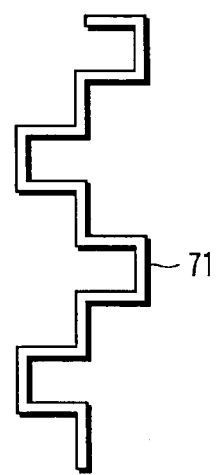
Figure 18:
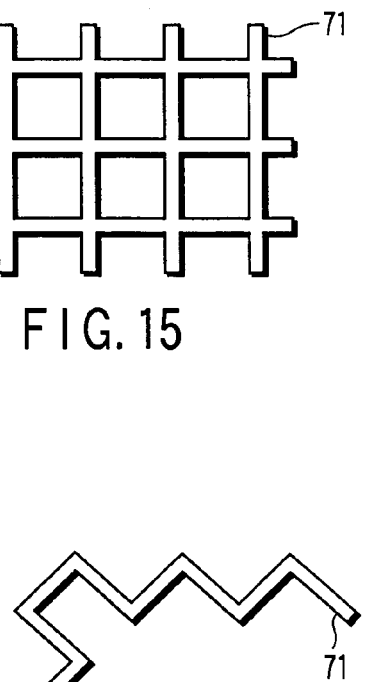

Modifications in the shape of the fence 71 on a plane will now be described with reference to FIGS. 16 to 19. The shape of the fence 71 on a plane is not necessarily linear. It suffices that the fence 71 properly spreads on a plane and to partition the no-element region 55 into small regions. To be more specific, fence 71 extending a direction may have a zigzagged shape and extend in a certain direction as a whole. That is, the fence 71 may alternatively extend along two parallel main straight lines that extend along a fence extending direction, as shown in FIG. 16. It is also possible for the fence 71 to extend alternatively along three main straight lines as shown in FIG. 17. The fence 71 may have a jaggy shape as shown in as shown in FIG. 18. That is, the main straight line extends in a direction different from the fence extending direction. Further, the wiring layers 13, 23, 33, 43 may differ from the plugs 14, 24, 34, 44 in shape on a plane. For example, the wiring layers 13, 23, 33, 43 may have a linear shape and the plugs 14, 24, 34, 44 may be shaped as shown in FIGS. 16 to 19.

It is also possible to change the shape of the region surrounded by the fence 71 in accordance with the mechanical strength of the site at which the fence 71 is arranged. To be more specific, the device region is partitioned in the shape of a lattice in the vicinity of the center of the device region as exemplified in FIG. 19. On the other hand, the device region is partitioned in the shape of, for example, a regular hexagon in the vicinity of the fence 52 (and the fence 56). In this case, angles made by each of ends of the fence 71 and the fence 52 differ from each other according to their position.

In the semiconductor device according to the sixth embodiment, it is possible to obtain the same effect as that in the first embodiment. In the sixth embodiment, the fence 71 partitions the no-element region 55 into small regions. As a result, the cracks and the scratches generated in the interlayer insulating films 12, 22, 32, 42 are kept within the partitioned region, preventing the cracks and the scratches from spreading over. The damage caused by the cracks and the scratches can be confined to a small range (within a single small region), when the region partitioned by the fence 71 is smaller. Also, it is possible to prevent the diffusion of the water and the gas in the interlayer insulating films 12, 22, 32, 42.

Also, according to the sixth embodiment, it is possible to obtain the same effect as that obtained by the conventional dummy pattern. To be more specific, the pressure applied in the CMP stage can be uniformly dispersed because the state in the no-element region 55 with the fence 71 is equal to the state where the dummy patterns are uniformly formed. Therefore, it is possible to planarize satisfactorily the film such as the interlayer insulating film 12 to which the CMP is applied. Also, it is possible to improve the uniformity of the pattern obtained as a result of the etching by RIE (Reactive Ion Etching).

Also, according to the sixth embodiment, the fence 71 is formed over a wide range and, thus, a large number of contact holes are formed during the manufacturing process. Therefore, the gas accumulated in the interlayer insulating films 12, 22, 32 consisting of a low-k material can be released efficiently.

Further, according to the sixth embodiment, each of the ends of the fence 71 reaches the fence 52 in variety of angles. If all of the ends of the fence 71 reach the fence 52 in the same angle, the force with which the fence 71 draws the fence 52 is concentrated on one direction and, thus, the force increases. As a result, the fence 52 may collapse to break the interlayer insulating film in the vicinity of the fence 52. On the other hand, according to a modification of the sixth embodiment, the direction of the force applied to the fence 52 is dispersed so as to prevent the fence 52 from collapsing. Also, it is possible to disperse the directions of the force applied among the fence 71 by varying the layout of the fence on a plane. Therefore, it is possible to prevent the fence 71 from warping.

Seventh Embodiment

In a seventh embodiment, a ring is formed around an opening as a mark. FIG. 20 is a plan view schematically showing the construction of a semiconductor device according to the seventh embodiment of the present invention. As shown in FIG. 20, a dicing line is formed on a semiconductor substrate, surrounding the device region. A mark section 81 is formed in an interlayer insulating film on the dicing line 53. A ring 82 is formed around the mark section 81.

Figure 21:
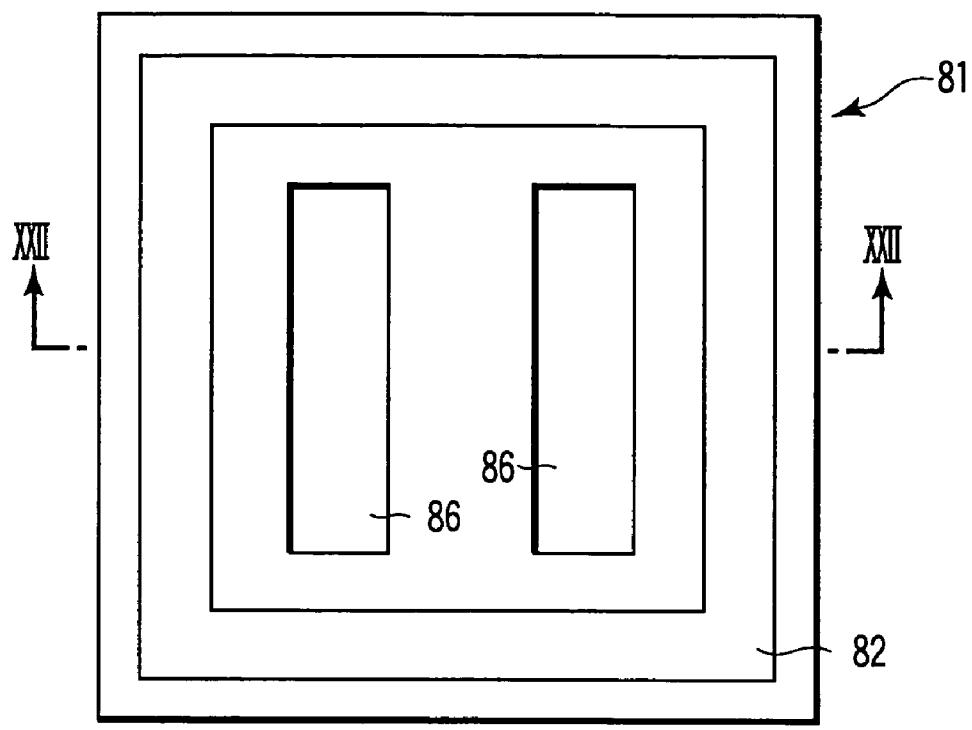
FIG. 21 is a plan view showing in a magnified fashion the periphery of the mark shown in FIG. 20.
Figure 22:
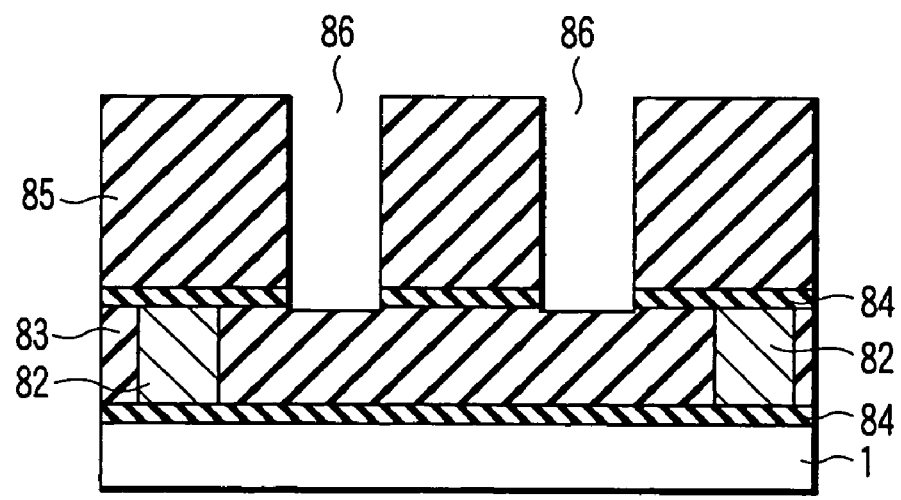
FIG. 22 is a sectional view taken along the line XXII-XXII shown in FIG. 21.

FIG. 21 is a plan view showing in a magnified fashion the periphery of the mark section 81 shown in FIG. 20, and FIG. 22 is a sectional view showing the construction taken along the line XXII-XXII shown in FIG. 21. As shown in FIGS. 21 and 22, an interlayer insulating film 85 is formed on a stopper film formed on an interlayer insulating film 83. Interlayer insulating films 83 and 85 consist of a low-k material. Contact holes 86 (openings) as a mark are formed in the interlayer insulating film 85 within the mark section 81. The contact hole 86 extends from the upper surface of the interlayer insulating film 85 to the interlayer insulating film 83. A ring 82 (first protective member) is formed within the interlayer insulating film 83. The ring 82 extends from the upper surface of the interlayer insulating film 83 to the lower surface of the interlayer insulating film 83, and surrounds continuously the contact holes 86 on a plane. No wiring layer or no plug is formed between the contact hole 86 and the ring 82. Typically, the ring 82 has a construction equal to the plug (not shown) formed in the interlayer insulating film 85.

Figure 23:
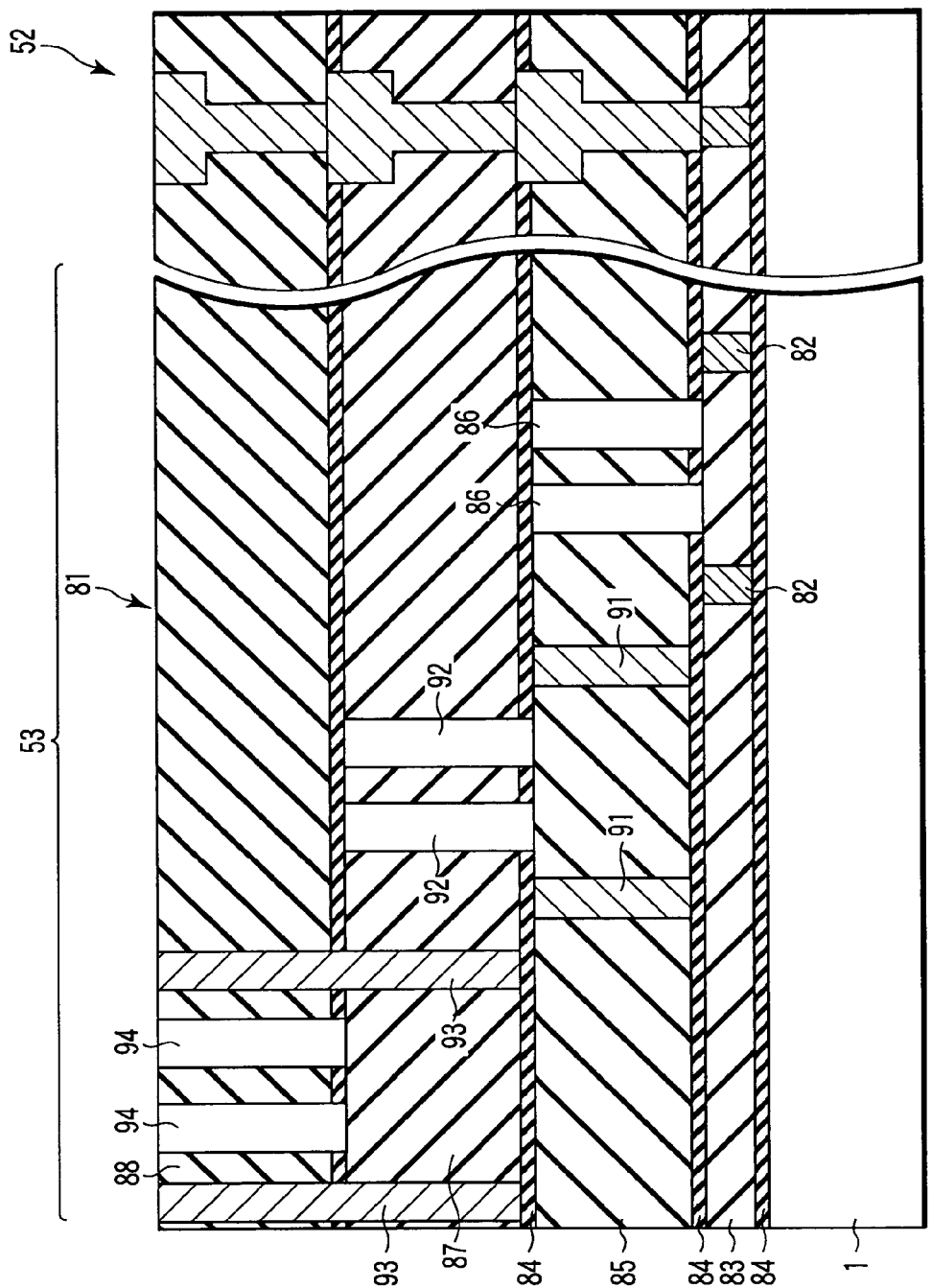
FIG. 23 is a sectional view showing as an example the construction of the semiconductor device according to the seventh embodiment.
Figures 24, 27:
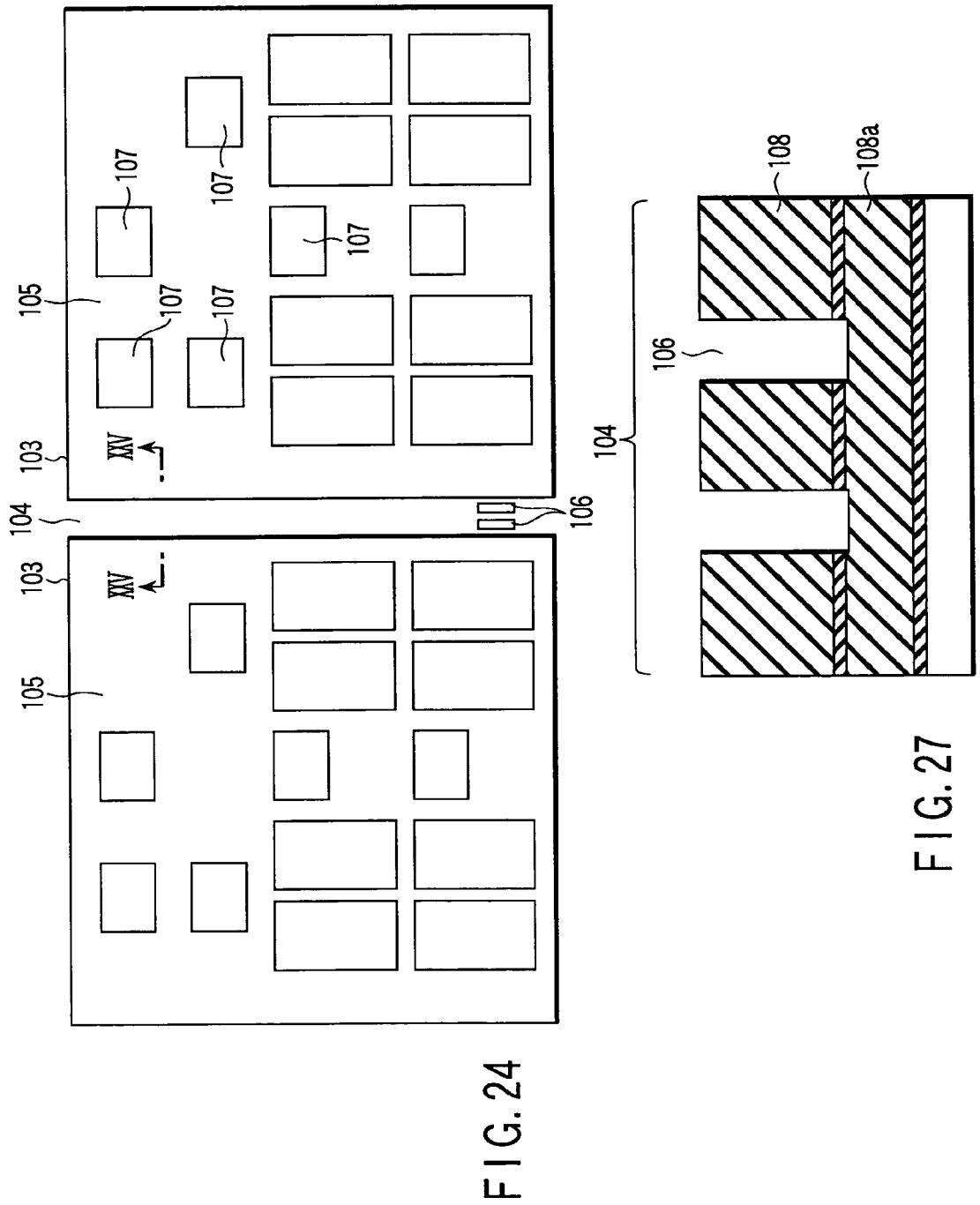
FIG. 24 is a plan view showing the construction of a semiconductor device having the conventional multi-layered wiring structure.
FIG. 27 is a sectional view showing the mark in the conventional semiconductor device.
Figure 25:
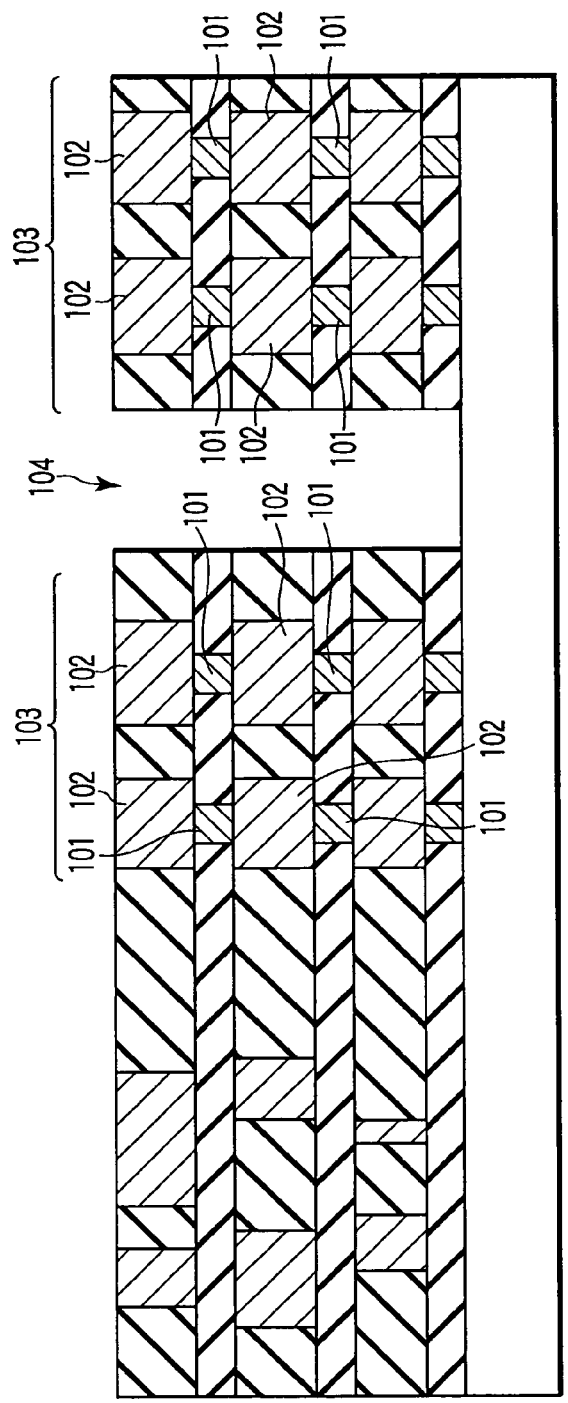
FIG. 25 is a sectional view taken along the line XXV-XXV shown in FIG. 24.
Figure 26:
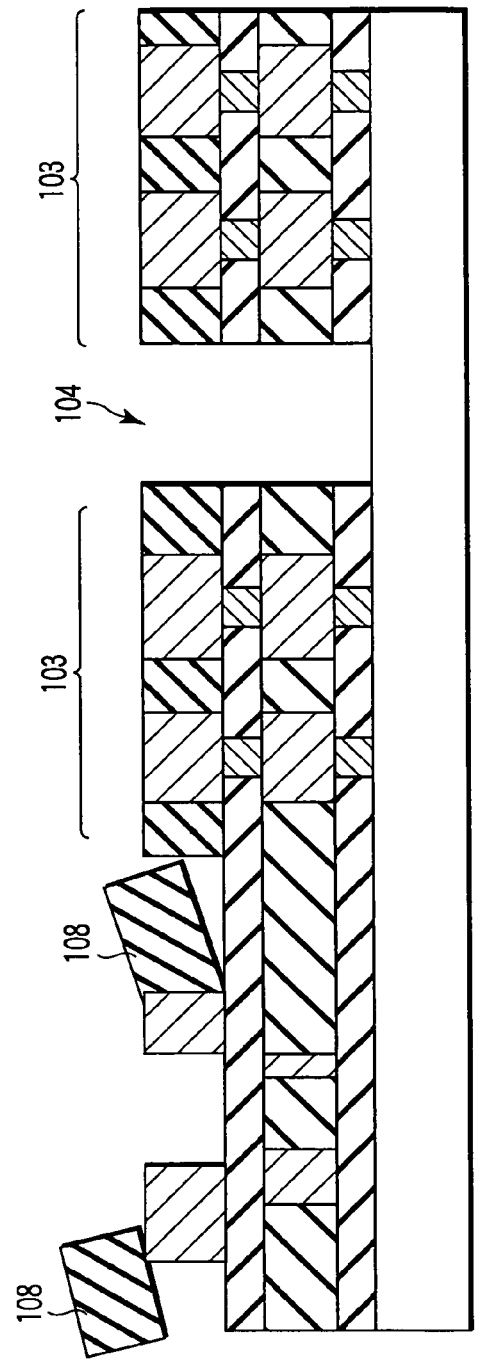
FIG. 26 is a sectional view showing the problem inherent in the conventional semiconductor device.

FIG. 23 schematically exemplifies the sectional construction of a semiconductor device according to the seventh embodiment. As shown in FIG. 23, a ring 91 is formed within the interlayer insulating film 85 apart from the contact hole 86. The ring 91 extends from the upper surface of the interlayer insulating film 85 to the lower surface of the interlayer insulating film 85 and surrounds continuously a part of the region within the interlayer insulating film 85. Further, a contact hole 92 as a mark is formed within an interlayer insulating film 87 above the region surrounded by the ring 91.

A ring 93 is formed in the interlayer insulating film 87 apart from the contact hole 92. The ring 93 extends from the upper surface of an interlayer insulating film 88, which is formed on a stopper film 83 on formed on the interlayer insulating film 87, to the lower surface of the interlayer insulating film 87. The ring 93 surrounds continuously a part of the region within the interlayer insulating films 87 and 88. A contact hole 94 as a mark is formed within that region of the interlayer insulating film 88 which is surrounded by the ring 93. The rings 92 and 94 are typically equal in construction to the plugs within the interlayer insulating films 87 and 88 of the same level.

In the semiconductor device according to the seventh embodiment, the ring 82 continuously surrounds the contact hole 86 in the interlayer insulating film 83, which lies below the interlayer insulating film 85 in which the contact hole 86 as a mark is formed. As a result, the diffusion of the water and the gas permeating into the interlayer insulating film 83 from the contact hole 86 as a mark is confined within the region surrounded by the ring 82, so as to prevent the water and the gas from diffusing over a wide range. Therefore, it is possible to avoid the decrease of the mechanical strength of the interlayer insulating film 83 and peeling of the interlayer insulating film 83.

Also, according to the seventh embodiment, it is unnecessary to form a metal film below the contact hole 86 as a mark in order to prevent the diffusion of the water and the gas. Therefore, it is unnecessary to worry about the migration of the metal atoms from the metal film into the interlayer insulating film 83.

Eighth Embodiment

Eighth to tenth embodiments of the present invention will be described. These embodiments have a multi-layered wire structure which includes a low-k film used as an interlayer insulating film and which has improved strength and flatness.

Generally, low-k films are mechanically weak, having a small Young's modulus. They have a layer structure of a low polarity to lower the dielectric constant. This is why they cannot firmly contact other films. Consequently, dielectric breakdown may occur at via plugs when a thermal process is performed, resulting in short-circuiting. Otherwise, the insulating film beneath the pads may be broken when bonding or probing is carried out.

The wire consists of Cu, whereas a barrier metal layer consists of Ta, Ti or the like. The difference in linear expansion coefficient between Cu and Ta, Ti or the like results in a prominent thermal stress in the barrier metal layer during a high-temperature process. The thermal stress may make cracks in the barrier metal layer. The cracks will extend into the interlayer insulating film, because the low-k film has but small breakdown strength. The material of the wire flows into the cracks, inevitably causing short-circuiting. The lower the dielectric constant of the film, the greater the thermal stress in the barrier metal layer. The greater the thermal stress, the higher the possibility of short-circuiting.

The insulating film may be broken due to a stress that develops beneath the pads during the bonding or probing. This phenomenon is prominent in inverse proportion to the relative dielectric constant of the insulating film.

As indicated above, a low-k film may be used as an interlayer insulating film. In this case, critical defects may very likely develop in the conductive elements such as via plugs, or the insulating film provided beneath the pads may probably be broken. If this happen, the process of manufacturing a semiconductor device will be jeopardized, and the semiconductor device made by the process will be defective.

Figure 35:
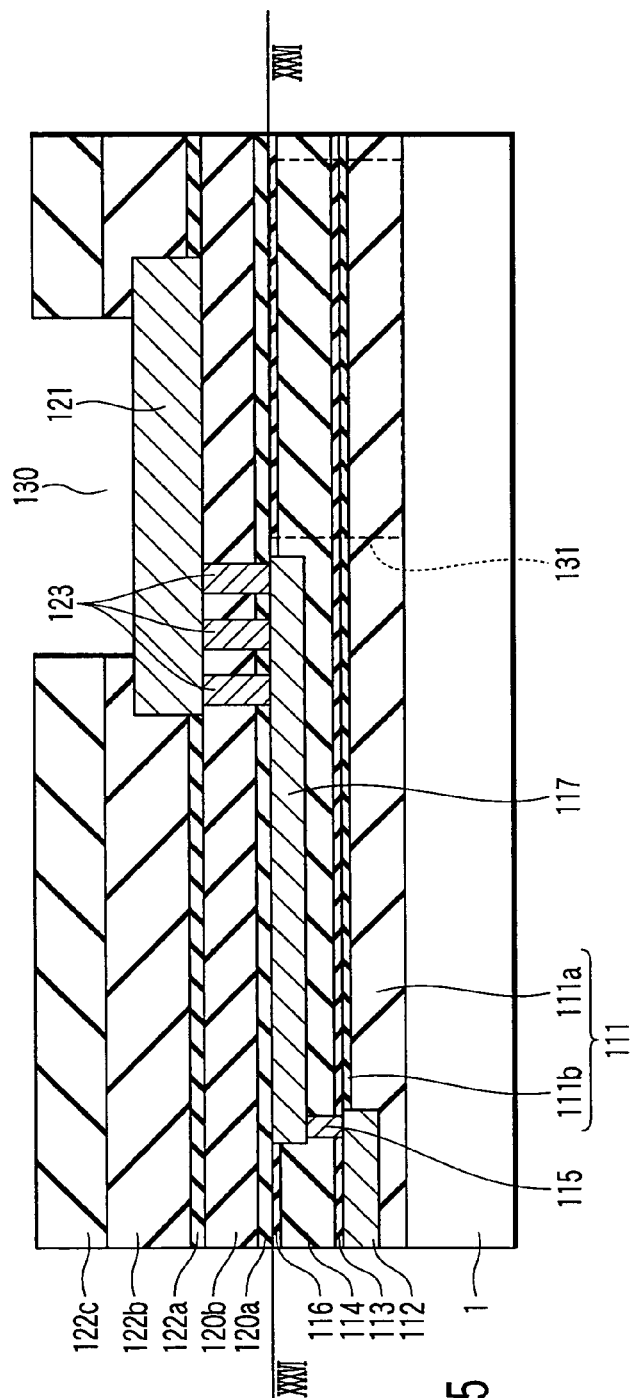
FIG. 35 is a schematic plan view depicting a part of a semiconductor device according to an eighth embodiment of the present invention.
Figure 36:
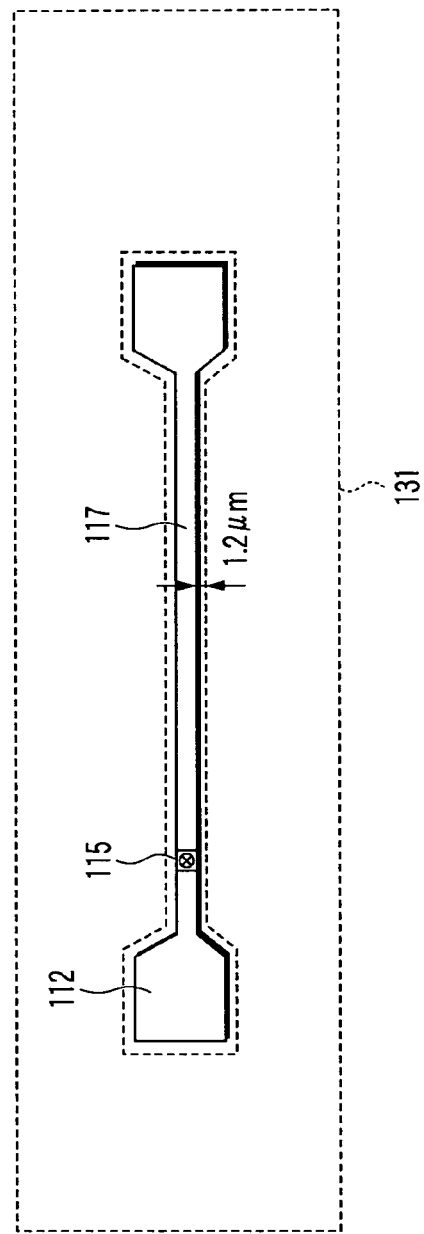
FIG. 36 is a schematic sectional view showing a part of the semiconductor device according to the eighth embodiment.

A semiconductor device according to the eighth embodiment will be described, with reference to FIGS. 35 and 36. FIG. 35 is a sectional view schematically illustrating a part of the semiconductor device according to the eighth embodiment. FIG. 36 is a sectional view taken along line XXXVI to XXXVI shown in FIG. 35. This embodiment is a semiconductor device that has, for example, a multi-layered Cu wiring structure. In the embodiment, at least one of the insulating films (interlayer insulating films), on which effective wires are provided, is a low-k film having dielectric constant of 3.4 or less. The semiconductor device has dummy wires located near the effective wires and having a via-fence structure.

As FIG. 35 shows, an interlayer insulating film 111 is provided above the semiconductor substrate. The film 111 is composed of two interlayer insulating film 111a and 111b. The film 111a is formed on the semiconductor substrate, and the film 111b is formed on the film 111a. The interlayer insulating film 111a is a low-k film consisting of, for example, polymethyl siloxane (having relative dielectric constant of 2.8). By contrast, the interlayer insulating film 111b is a high-strength film consisting of, for example, silicon oxide. A wiring layer 112 is provided in the surface of the interlayer insulating film 111. On the interlayer insulating film 111 and wiring layer 112, an etching stopper film 113 is provided. The etching stopper film 113 consists of, for example, silicon nitride (having relative dielectric constant of 7.0). An interlayer insulating film 114 is provided on the etching stopper film 113. The interlayer insulating film 114 is a low-k film that can be consisting of polymethyl siloxane (having relative dielectric constant of 2.8). Alternatively, the film 114 may be consisting of material having dielectric constant of 3.4 or less. Examples of such material are hydrogen silsesquioxane, carbon-containing $SiO_2$ (SiOC), porous silica, macromolecular material, and amorphous carbon (F-doped). Otherwise, the interlayer insulating film 114 may be a multi-layered one composed of two or more films that consist of at least one of the materials exemplified.

Figure 28:
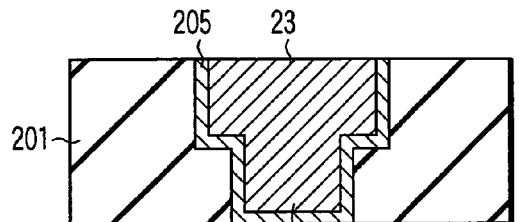
FIGS. 28 to 33 are sectional views each exemplifying the construction of the interlayer insulating film.
Figure 31:
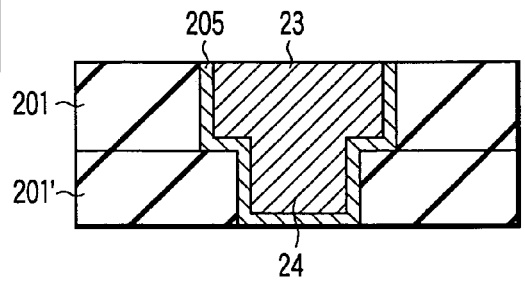
Figure 29:
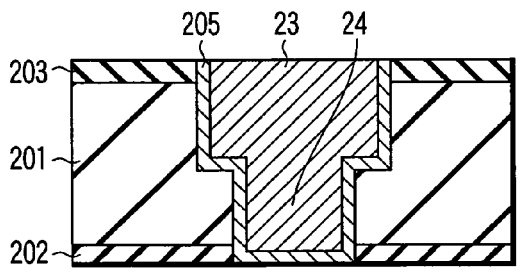
Figure 32:
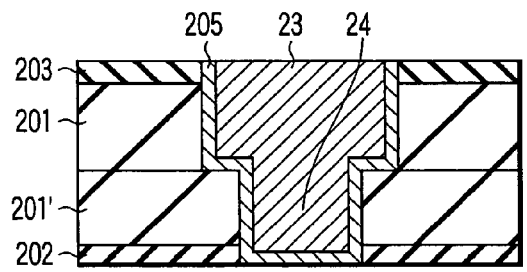
Figure 30:
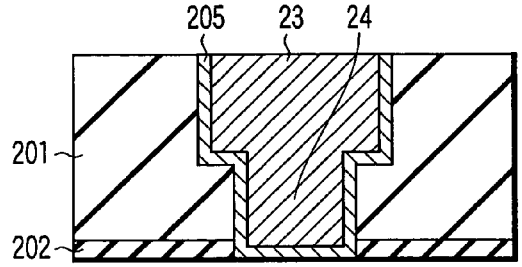
Figure 33:
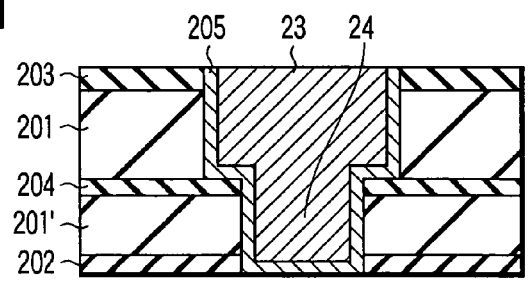

A silicon oxide film 116 is provided on the interlayer insulating film 114. A plug (via plug) 115 is formed in the etching stopper film 113 and interlayer insulating film 114. The plug 115 is connected to the wiring layer 112. A wiring layer 117 is formed in the interlayer insulating film 114 and silicon oxide film 116. The wiring layer 117 is connected at its bottom to the plug 115. The plug 115 and wiring layer 117 have been formed by filling conductive material in the via hole made in the etching stopper film 113 and interlayer insulating film 114 and a wiring trench made in the interlayer insulating film 114. The conductive material may be Cu, Al or alloy containing Cu or Al. A barrier metal layer (not shown) may be provided, extending along the wiring trench for forming the wiring layer 117 and the surface of the via hole for forming the plug 115, like the barrier metal layer 205 that is shown in FIG. 28. A protective film 120a is provided on the silicon oxide film 116 and the wiring layer 117. A protective film 120b is provided on the protective film 120a. The protective films 120a and 120b may be, for example, a silicon nitride film and a silicon oxide film, respectively.

A pad 121 is formed on the protective film 120b. The pad 121 consists of, for example, Al. A plug 123 is provided in the protective films 120a and 120b. This plug 123 connects the pad 121 to the wiring layer 117. A barrier metal layer (not shown) may be provided, surrounding the plug 123. A protective film 122a is provided, surrounding the pad 121 formed on the protective film 120a. The protective film 122a may be consisting of, for example, silicon nitride. A protective film 122b is provided on the protective film 122a, and a protective film 122c is provided on the protective film 122c. The films 122b and 122c have an opening 130, which exposes the pad 121. The protective films 122b and 122c may be consisting of, for example, silicon oxide or silicon nitride.

A reinforcing member is provided in those parts of the interlayer insulating films 111 and 114, etching stopper layer 113 and silicon oxide film 116, in which the wiring layer 112 or 117 is not formed. The reinforcing member will be described later.

As FIG. 36 shows, the region (reinforcing-member region 131), where the reinforcing member is provided, surrounds, for example, the wiring layers 112 and 117. More precisely, the reinforcing-member region 131 surrounds the wiring layers 112 and 117, spaced apart from them by a distance of, for example, 1.2 µm.

The structure shown in FIGS. 35 and 36 is provided in a chip region (semiconductor chip 51) that is surrounded by a fence (chip ring) 52 of the type illustrated in FIGS. 2 and 3.

The reinforcing member will be described, with reference to FIGS. 37 to 39. The reinforcing member is composed of wiring layers and vias, which are provided in a plurality of layers. In the present embodiment, the reinforcing member has a structure selected from three types shown in FIGS. 37 to 39.

Figure 37:
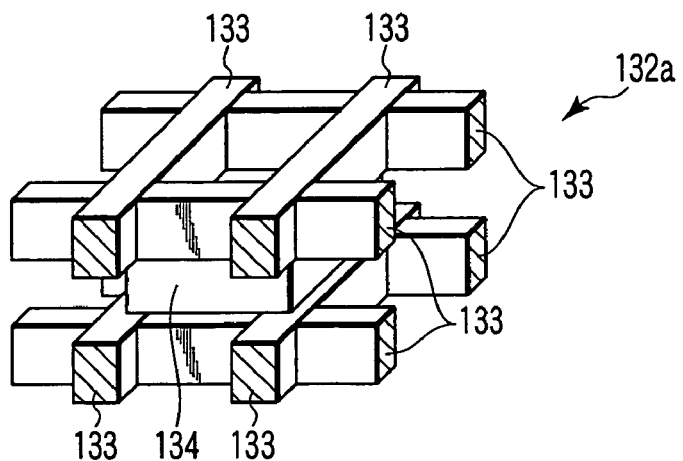
FIGS. 37, 38, and 39 are perspective views illustrating a reinforcing member used in the eighth embodiment.

As FIG. 37 depicts, the reinforcing member 132a of the first type is composed of reinforcing wiring layers 133 and reinforcing via fences 134. Like the fence 52 used in the first embodiment, the reinforcing wiring layers 133 and the reinforcing via fences 134 have a wall-shaped cross section. They form a mesh-like structure in a horizontal plane. The mesh-like structure comprises first lines that extend parallel in a first direction, and second lines that extend parallel in a second direction, intersecting with the first lines. The reinforcing wiring layers 133 are, for example, 0.3 µm wide. The reinforcing via fences 134 are, for example, 0.1 µm wide. The wiring layers 133 and the via fences 134 define square openings, each measuring, for example, 1.03 m×1.03 m. Thus, the reinforcing member 132a covers, for example, 40% of the reinforcing-member region 131.

Figure 38:
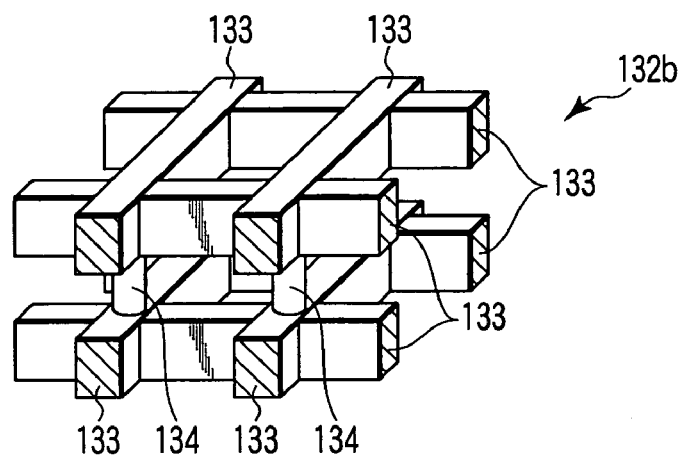

FIG. 38 shows a reinforcing member 132b of the second type. This reinforcing member 132b is composed of reinforcing wiring layers 133 and reinforcing plugs 135. The wiring layers 133 forms a mesh-like structure in a horizontal plane. Some of the layers 133 intersect with the remaining layers 133. The reinforcing plugs 135 are arranged at the intersections of the wiring layers 133. The square openings of the mesh-like structure have the same size as in the reinforcing member 132a of the first type (FIG. 37). As in the first type (FIG. 37), the reinforcing member 132a covers, for example, 40% of the reinforcing-member region 131. The reinforcing via plugs 135 have a diameter of, for example, 0.1 µm.

Figure 39:
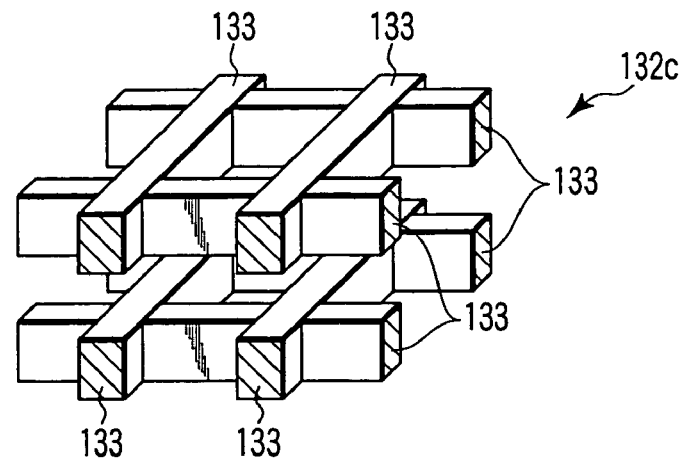

FIG. 39 shows a reinforcing member 132c of the third type. The reinforcing member 132c is composed of reinforcing wiring layers 133 only. The wring layers 133 form a mesh-like structure in a horizontal plane. The reinforcing wiring layers 133 have the same width as those of the first-type reinforcing member (FIG. 37). The square openings of the mesh-like structure have the same size as in the reinforcing member 132a of the first type (FIG. 37). Like the first-type reinforcing member (FIG. 37), the reinforcing member 132c covers, for example, 40% of the reinforcing-member region 131.

The advantages of the structure of FIGS. 35 and 36, which has a reinforcing member of any one of the above-mentioned three types (FIGS. 37 to 39) will be described. To demonstrate the advantages of the structure, three structures having the reinforcing members of the first to third types, respectively, were tested, along with a reference structure that has no reinforcing members.

More specifically, the four structures were subjected to four tests. The first test was to measure the amount of dishing of the wiring layer 117, which was observed after performing CMP. The second test was to determine whether the interlayer insulating film 114 surrounding the plug 115 was broken at the time of sintering. The third test was to determine whether the interlayer insulating film 114 beneath the pad 121 was broken at the time of bonding. The fourth test was a temperature cycling test (TCT) that was performed after dicing and packaging.

A method of manufacturing the structure shown in FIG. 36 and a method of testing the same to determine the advantage of using the reinforcing members 132a to 132c will be described in detail.

First, interlayer insulating films 111a and 111b are deposited one after the other, forming an interlayer insulating film 111. Then, a wiring layer 112 having a barrier metal layer on its surface is formed, buried in the interlayer insulating film 111. An etching stopper film 113 is formed by means of, for example, plasma CVD.

An interlayer insulating film 114 is formed. More specifically, varnish is spin-coated on the upper surface of the resultant structure, i.e., etching stopper film 113 by using a coater. The varnish has been prepared by dissolving the material of the film 113 or its cursor (polymethyl siloxane) in solvent. Then, the resultant structure is mounted on a hot plate maintained at 80° C. and heated for one minute. The structure is then placed on a hot plate maintained at 200° C. and heated for one minute. Finally, the structure is put on a hot plate maintained at 450° C. and heated for 30 minutes in a nitrogen atmosphere.

Further, a silicon oxide film 116 is formed on the interlayer insulating film 114 by means of, for example, plasma CVD.

A via hole for forming a plug 115 is made in the interlayer insulating film 114 and silicon oxide film 116, by means of, for example, lithography and etching such as RIE. A wring trench for forming a wiring layer 117 is made in the region having the via hole thus made in interlayer insulating film 114 and silicon oxide film 116, by means of, for example, photolithography and etching such as RIE. The etching stopper film 113 is removed from the bottom of the via hole. The wiring layer 112 is thereby exposed.

A barrier metal layer is deposited at 150° C. on the upper surface of the resultant structure (that is, on the silicon oxide film 116 and in the wiring trench). Copper (Cu) is deposited in the via hole and the wring trench, thus providing seeds for plating the wiring layer 117. Copper is then buried in the via hole and wiring trench through plating. The resultant structure is subjected to annealing, which is performed in an electric furnace or on a hot plate. More precisely, the annealing is carried out at 150° C. to 300° C. for about one hour in the electric furnace, or for about one minute to five minutes on the hot plate.

Excessive parts of the barrier metal layer and those of the wiring layer 117 are removed from the silicon oxide film 116, by means of, for example, CVD. The amount of dishing was measured of the reinforcing member (FIG. 37) having via fences, the reinforcing member (FIG. 38) having via plugs, the reinforcing member (FIG. 39) having no via plugs or via fences (FIG. 39), and the structure having no reinforcing members. The results were as is shown in FIG. 40. In FIG. 40, mark "o" indicates any desirable structure that had steps of 40 nm or less in the chip, and mark "x" indicates any undesirable structure that had steps of more than 40 nm. As seen from FIG. 40, the three structures that had reinforcing members 132a, 132b and 132c, respectively, were desirable, whereas the structure that had no reinforcing members was undesirable.

Next, plasma CVD is performed at 380° C., forming protective films 120a and 120b. Subsequently, via holes for forming plugs 123 are made in the protective films 120a and 120b, by means of lithography and RIE or the like. The material of a barrier metal layer 205 is deposited at a temperature of, for example, 150° C. on the upper surface of the resultant structure (i.e., the upper surface of the protective film 120b), covering the surface of the via holes. Further, material of a pad 121 is deposited by, for example, sputtering. The barrier metal layer 205 and the film of the pad material are etched by lithography and RIE or the like. The pad 121 is thereby formed.

Plasma CVD is then carried out at a temperature of, for example, 380° C., forming protective films 122a, 122b and 112c on the entire upper surface of the resultant structure. The structure is placed in an electric furnace and subjected to sintering at 370° C. for 60 minutes in an atmosphere of forming gas. The reinforcing member having via fences, the reinforcing member having via plugs, and the reinforcing member having no via plugs or via fences, and the structure having no reinforcing members, all sintered, were observed under an optical microscope, to determine whether the interlayer insulating film 114 surrounding the plug 115 had been broken or not. The results were as shown in FIG. 40. In FIG. 40, mark "o" indicates any desirable structure in which the film 114 had not been broken, and mark "x" indicates any undesirable structure in which the film 114 had been broken. As evident from FIG. 40, the film 114 had not been broken in the structure having reinforcing members with via fences and the structure having reinforcing members with via plugs were desirable. However, the film 114 had been broken in the structure having reinforcing members without via fences or via plugs and in the structure having no reinforcing members.

Then, the protective films 122c and 122b are removed from the pad 121 by lithography and RIE or the like. The structure shown in FIG. 36 is thereby provided.

Dicing is performed on the resultant structure, which is cut into chips. Each chip is mounted on a package substrate. Wire bonding is carried out at a load of 50 gf. Semiconductor devices are thus manufactured.

Some of the devices thus made were sampled out. The wires and the pads 121 were removed from these samples by means of wet etching. Further, the barrier metal layer beneath the bad 121 was removed by chemical dry etching (CDE). The samples were examined through an optical microscope to see whether the insulating film beneath the pad 121 had been broken. The results were as shown in FIG. 40, too. In FIG. 40, mark "o" indicates any desirable structure in which the insulating film had not been broken, and mark "x" indicates any undesirable structure in which the insulating film had been broken. As FIG. 40 shows, the structure having reinforcing members with via fences were desirable, whereas the structure having reinforcing members with via plugs, the structure having reinforcing members without via plugs or via fences, and the structure having no reinforcing members were undesirable.

The semiconductor devices, not sampled, were packaged or sealed in resin capsules and subjected to TCT test. The TCT test was repeated 1000 times, changing the temperature from −40° C. to 125° C. each time, to determine the thermal hysteresis of each semiconductor device. The results of the TCT were as shown in FIG. 40. In FIG. 40, mark "o" indicates any desirable structure in which any insulating film, for example, had not peeled off, and mark "x" indicates any undesirable structure in which the insulating film had peeled off. As FIG. 40 reveals, the structure having reinforcing members with via fences were desirable, whereas the structure having reinforcing members with via plugs, the structure having reinforcing members without via plugs or via fences, and the structure having no reinforcing members were undesirable.

In the semiconductor device that is the eighth embodiment of this invention, a reinforcing member 132a, for example, surrounds the wiring layer 112 and 117 and the like. The semiconductor device proves to be desirable because of the small amount of dishing at the time of CMP, the low possibility of dielectric breakdown at sintering or bonding and the good results of TCT test. More precisely, the device has multi-layered Cu wiring structure which comprises the interlayer insulating film 114 that has a low-k of 3.4 or less and which includes the reinforcing member 132 with via fences. Hence, the semiconductor device excels in quality, performance, reliability and productivity.

Low-k films tend to have smaller mechanical strength as their relative dielectric constant decreases. Therefore, the reinforcing member 132a with via fences can inhibit dielectric breakdown of the low-k films at the time of sintering and bonding, particularly the low-k films have a relative dielectric constant of 2.6 or less.

Ninth Embodiment

In the ninth embodiment, the reinforcing member 132a having via fences is different from its counterpart of the eighth embodiment, in the coverage on the reinforcing-member region, the width of wires, and the width of via fences.

Except the properties of the reinforcing member 132, the ninth embodiment is identical to the eighth embodiment. Further, the ninth embodiment is manufactured in the same method as the eighth embodiment. Various samples of reinforcing member 132a for use in the ninth embodiment were made, which differ in the coverage on the reinforcing-member region 131, the wire width of reinforcing wiring layers 133, and the width of via fences 134. These samples were examined for their flatness and their ability of inhibiting dielectric breakdown.

The ninth embodiment uses the reinforcing member 132a shown in FIG. 37, which has via fences that constitute a mesh-like structure. The samples of the member 132a were made. The samples differ in the coverage on the reinforcing-member region 131, the width of reinforcing wiring layers 133, and the width of via fences 134. The coverage on the region 131 ranges from 10% to 90%. The width of layers 133 ranges from 0.3 µm to 10 µn. The width of via fences 134 ranges from 0.1 µm to 1.0 µm. The physical properties of the samples are shown in FIG. 41.

To demonstrate the advantage of the reinforcing member 132a, the samples were subjected to four tests identical to those performed in the eighth embodiment. The results of the test were as shown in FIG. 41, too.

(1) Test for the Coverage on the Region 131

Samples of the reinforcing member 132a were made. They were identical in wire width of 0.3 µm and via-fence width of 0.1 µm (fringe of 0.1 µm). They had different coverages of 10%, 20%, 30%, 40%, 60%, 80% and 90%, respectively.

These samples of the member 132a were examined for their amount of dishing at the time of CMP. In FIG. 41, mark "o" indicates any sample having the maximum step of less than 40 nm, mark "Δ" indicates any sample having the maximum step of 40 nm to 100 nm, and mark "x" indicates any sample having the maximum step exceeding 100 nm. As seen from FIG. 41, the samples that covered 10% and 90% of the reinforcing-member region 131 had maximum step exceeding 100 nm (mark "x"); the samples that covered 20% and 80% of the region 131 had maximum step ranging form 40 nm to 100 nm (mark "Δ"); the samples that covered 30%, 40% and 60% of the region 131 had maximum step of less than 40 nm (mark "o").

In terms of the dielectric breakdown around the via plugs, that may occur at the time of sintering, the sample which covered 10% of the region 131 was an undesirable one. Nonetheless, any other samples were desirable ones. Note that the sintering was carried out in an electric furnace, in a forming-gas atmosphere and at 370° C. for 60 minutes, as in the eighth embodiment.

To determine whether dielectric breakdown occurs beneath the pad at the time of bonding, the test was performed, applying two bonding loads of 50 gf and 26 gf. In FIG. 41, mark "o" indicates any sample in which no dielectric breakdown was observed at the bonding load of 50 gf. Mark "Δ" indicates any sample in which dielectric breakdown was observed at the bonding load of 50 gf, but not at the bonding load of 26 gf. Mark "x" indicates any sample in which dielectric breakdown was observed even at the bonding load of 26 gf. As FIG. 41 shows, the samples covering 10% of the region 131 were undesirable ones (x), the samples covering 20% of the region 131 were rather desirable (Δ), and the samples covering at least 30% of the region 131 were desirable ones (o).

As for the TCT test, mark "o" indicates any sample that remained desirable after its temperature had been changed more than 1000 times, from −40° C. to 125° C. each time. Mark "Δ" indicates any sample that became undesirable after its temperature had been changed 500 to 1000 times, from −40° C. to 125° C. each time. Mark "x" indicates any sample that became undesirable after its temperature had been changed 500 to less than 500 times, from −40° C. to 125° C. each time. As seen from FIG. 41, the samples that covered 10% of the region 131 were undesirable ones (x); the samples that covered 20% of the region 131 were rather desirable (Δ); the samples that covered 30% or more of the region 131 were desirable ones (o).

As indicated above, any sample of the dummy wiring structure having via fences had sufficient flatness at the time of CMP, underwent no dielectric breakdown at the time of sintering or bonding and cleared the TCT test if it covered 20 to 80% of the reinforcing-member region 131. Any sample that covered 30 to 60% of the region 131 proved more desirable in terms of the flatness at the time of CMP, the resistance to dielectric breakdown and the result of the TCT test.

(2) Test for the Width of Reinforcing Wiring Layers

Samples of the reinforcing wiring layers 133 were prepared. They were identical in coverage on the reinforcing-member region 131, each covering 40% of the region 131. They had different widths, 0.3 µm, 0.5 µm, 1.5 µm and 10 µm, respectively. The samples had the same coverage on the region 131. Therefore, the square openings of the mesh-like structure that the layers 133 of each sample form differed in accordance with the width of the sample, as will be described below:

1. The openings were 1.03 µm×1.03 µm when the wire width of the wiring layers was 0.3 µm.
2. The openings were 1.72 µm×1.72 µm when the wire width of the wiring layers was 0.5 µm.
3. The openings were 3.44 µm×3.44 µm when the wire width of the wiring layers was 1 µm.
4. The openings were 17.18 µm×17.18 µm when the wire width of the wiring layers was 5 µm.
5. The openings were 34.36 µm×34.36 µm when the wire width of the wiring layers was 10 µm.

The fringe width was fixed at 0.1 µm. The reinforcing via fences 134 of each sample had the width shown in FIG. 41.

As seen from FIG. 41, the samples that had wiring layers having a width of 10 µm were rather desirable (Δ) and the other samples were desirable (o), in terms of the amount of dishing at the time of CMP.

As for the dielectric breakdown around via plugs at the time of sintering, all samples proved to be desirable, because no dielectric was broken.

As for the dielectric breakdown at the insulating film beneath the pads at the time of bonding, the sample that had wiring layers having a width of 10 µm was undesirable (x), the sample that had wiring layers having a width of 5 µm was rather desirable (Δ), and all other samples were desirable (o).

The TCT test showed that the sample that had wiring layers having a width of 10 µm was undesirable (x), the sample that had wiring layers having a width of 5 µm was rather desirable (Δ), and all other samples were desirable (o).

As indicated above, if the reinforcing member 132*a* comprises reinforcing wiring layers 133 having a width of 5 or less, the member 132*a* is desirable in terms of the flatness at the time of CMP, dielectric breakdown at the time of sintering and bonding, and the results of the TCT test. In addition, the reinforcing member 132*a* will be more advantageous if the reinforcing wiring layers 133 have a width of 1 µm or less.

(3) Test for the Fringe Width

To demonstrate how the fringe width influences the quality of the reinforcing member 132*a*, several samples were prepared and tested. The samples are identical in that the reinforcing wiring layer 133 cover 40% of the reinforcing-member region 131 and have a width of 1 µm. They differ in fringe width and via-fence width. Some sample have a fringe width that is 45% of the layer width, some other samples have a fringe width that is 35% of the layer width, still some others have a fringe width that is 25% of the layer width, some other have a fringe width that is 10% of the layer width, and the remaining samples are borderless (having no fringe at all). The via-fence widths of these samples are shown in FIG. 41. Note that the samples having a fringe width of 45% have a via-fence width of 0.1 µm; the samples having a fringe width of 35% have a via-fence width of 0.3 µm; the samples having a fringe width of 25% have a via-fence width of 0.5 µm; the samples having a fringe width of 10% have a via-fence width of 0.8 µm; and the samples having no fringe have a via-fence width of 1 µm.

All samples proved to be desirable in terms of the dishing amount at the time of CMP, the dielectric breakdown around the via plugs at the time of sintering and the result of TCT test.

In terms of the dielectric breakdown at the insulating film beneath the pads, the samples having a fringe width of 45% were undesirable (x), the samples having a fringe width of 35% were rather desirable (Δ), and the remaining samples having a fringe width less than 35% were desirable (o).

As can be understood from the above, the reinforcing member 132*a* with the via fence having fringe width of 35% is desirable in terms of the flatness at the time of CMT, the dielectric breakdown at the time of sintering and bonding and the result of TCT test. The reinforcing member 132*a* will be more desirable if it has a fringe width of 25% or less.

A semiconductor device according to the ninth embodiment is desirable in terms of the amount of dishing at the time of CMT, the dielectric breakdown at the time of sintering and bonding and the result of TCT test, if the reinforcing wiring layers 133 cover 20 to 80% of the reinforcing-member region 131 and have a width of 5 µm or less and if the reinforcing member 132*a* has a fringe width of 35% or less of the reinforcing wiring layers 133. The reinforcing member 132*a* is more desirable if the reinforcing wiring layers 133 cover 30 to 60% of the reinforcing-member region 131 and have a width of 1 µm or less and if the reinforcing member 132*a* has a fringe width of 25% or less of the reinforcing wiring layers 133. As a result, the semiconductor device can excel in quality, performance, reliability and productivity.

Figure 42:
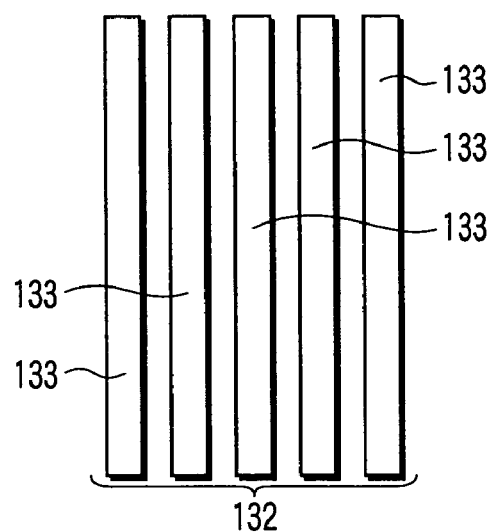
FIGS. 42, 43, 44, and 45 are plan views showing reinforcing members of other structures.
Figure 43:
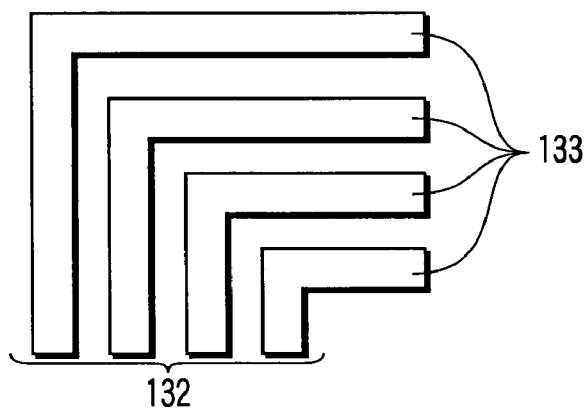

The description is given to the case where the reinforcing member 132*a* form a mesh-like structure in a horizontal plane. Nevertheless, the reinforcing member 132*a* need not have a mesh-like structure if the reinforcing wiring layers 133 cover 20 to 80% of the reinforcing-member region 131 and have a width of 5 µm or less and if the reinforcing member 132*a* has a fringe width of 35% or less of the reinforcing wiring layers 133. For example, the reinforcing wiring layers 133 may be straight layers that extend in one direction and parallel to one another as is illustrated in FIG. 42. Alternatively, the reinforcing wiring layers 133 may be L-shaped, each bent at right angles, as shown in FIG. 43. The structures of FIGS. 42 and 43 achieve the same advantage as a mesh-like structure.

Figure 44:
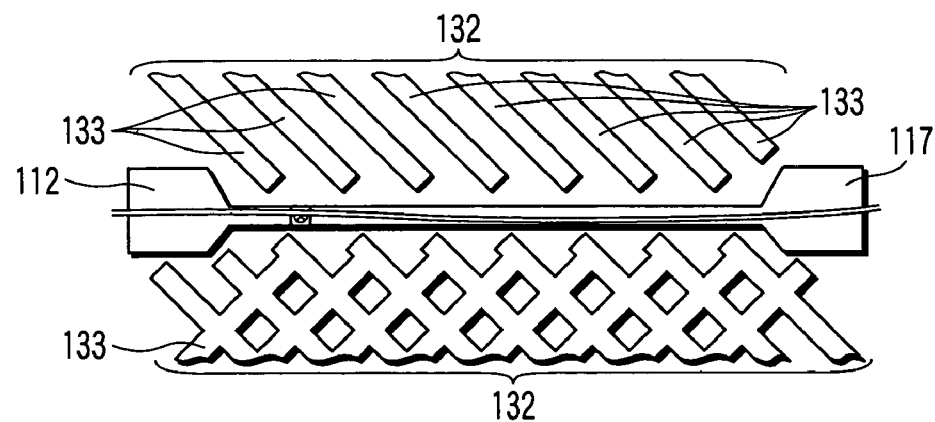

The reinforcing wiring layers 133 may incline to the wiring layers actually laid (i.e., wiring layer 112 and 117, and the like). In this case, too, the reinforcing member 132*a* attains the same advantage as specified above. That is, as FIG. 44 shows, the layers 133 may extend neither at right angles to nor parallel to the wiring layer 112 and 117. Prominent advantages can be achieved when the layers 133 incline at 45° to the wiring layer 112 and 117. Since the wiring layers 117 extend in one direction and the reinforcing wiring layers 133 extend in another direction, the stress resulting from the thermal expansion of the wiring layers 117 is dispersed. This is why the reinforcing member 132 is more resistant to the thermal stress than in the case where the reinforcing member 132 and the wiring layers 117 extend in the same direction. In this case, the reinforcing member 132 with via fences may either of the mesh-like structure of FIG. 37 or the stripe-like structure of FIG. 42 or 43.

Figure 45:
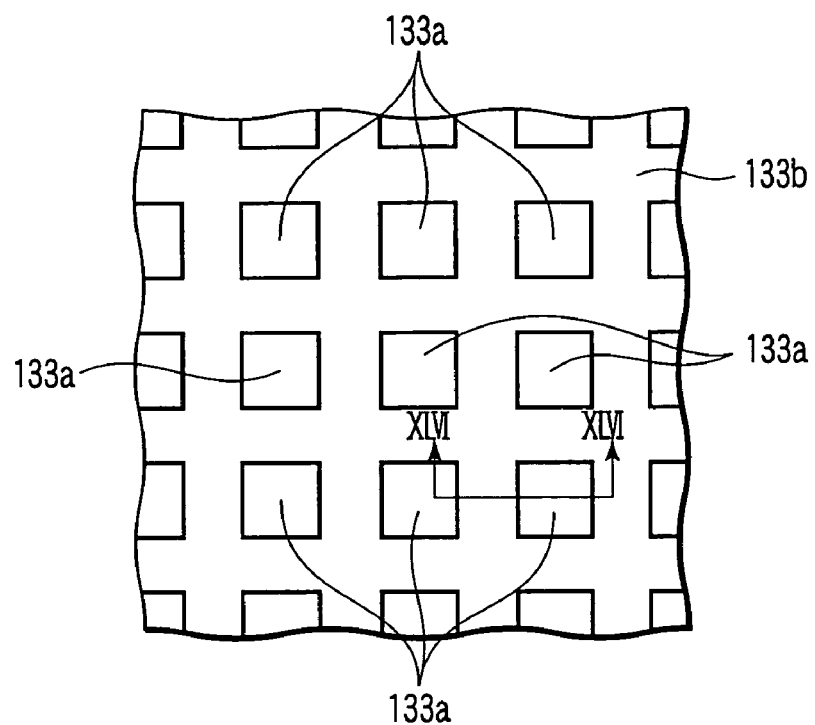
Figure 46:
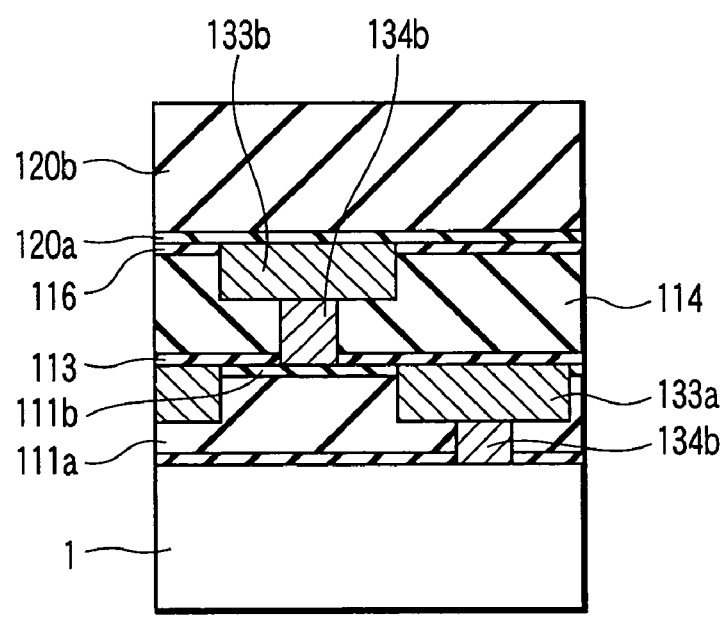
FIG. 46 is a sectional view taken along line XLVI-XLVI shown in FIG. 45.

As FIGS. 45 and 46 show, the reinforcing members 132*a* may be displaced in horizontal direction such that the wiring layers 133*a* of the lower member 132*a* do not overlap the wiring layers 133*b* of the upper member 132*b*. This arrangement of the reinforcing members 132*a* achieves the same advantages mentioned above. FIG. 46 is a sectional view taken along line XLVI-XLVI shown in FIG. 45. In the structure of FIGS. 45 and 46, the interface between any conductive layer and the adjacent insulating layer of the lower reinforcing member 132*a*, at which a stress is applied at the time of bonding, probing and dicing, does not overlap the interface between any conductive layer and the adjacent insulating layer of the upper reinforcing member 132*b*. Hence, the structure of FIGS. 45 and 46 is more resistant to stress than in the case where the wiring layers 133*a* of the lower member 132*a* overlap the wiring layers 133*b* of the upper member 132*b*. In this case, the reinforcing member 132*a* with via fences may either of the mesh-like structure of FIG. 37 or the stripe-like structure of FIG. 42 or 43. Furthermore, the reinforcing wiring layers 133 may incline to the wiring layers 133 and 117 as is illustrated in FIG. 44.

Tenth Embodiment

The tenth embodiment of this invention aims at enhancing the strength and flatness of a structure that comprises a plurality of interlayer insulating films, one laid upon another, each having a low-k.

Figure 47:
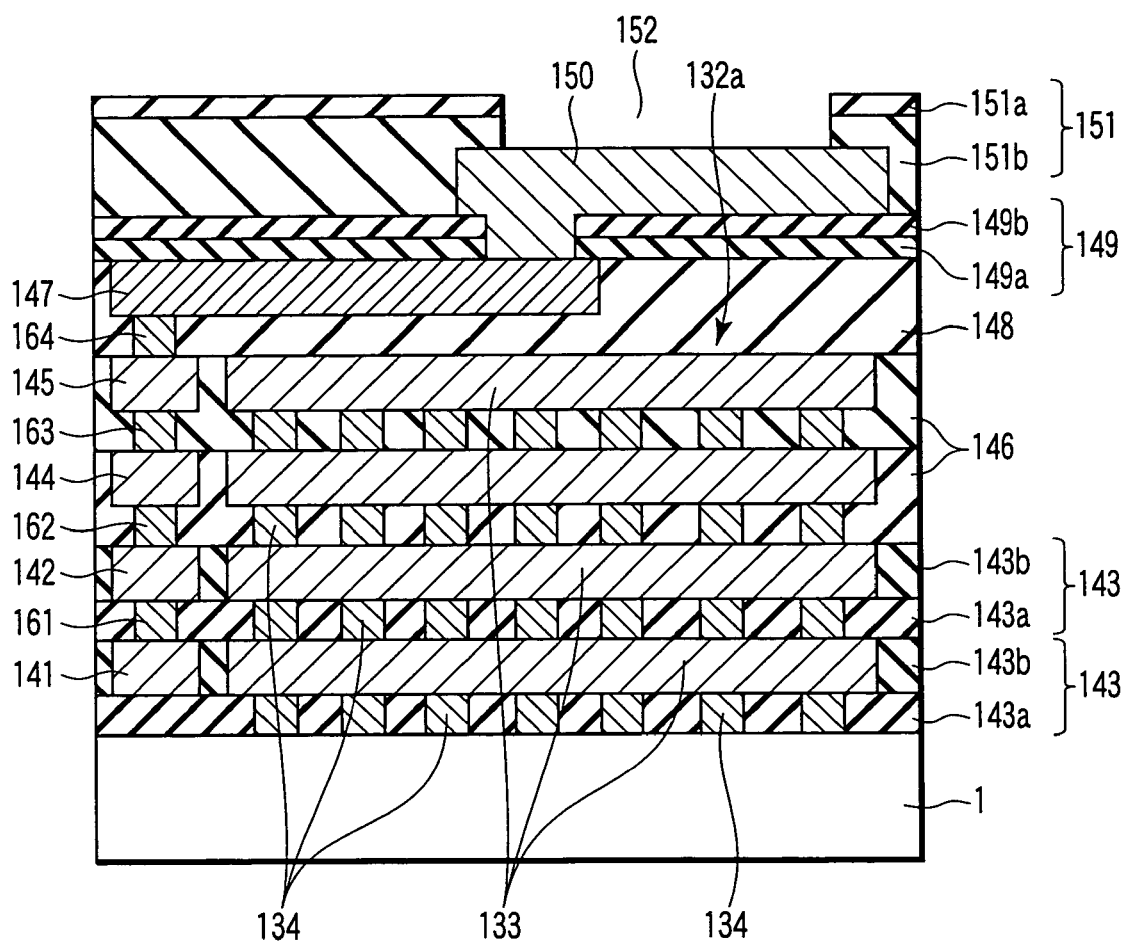
FIG. 47 is a sectional view depicting a semiconductor device according to a tenth embodiment of the present invention.

A semiconductor device according to the tenth embodiment will be described, with reference to FIG. 47. FIG. 47 is a sectional view schematically depicting this semiconductor device. As FIG. 47 shows, an interlayer insulating film 143 having dielectric constant of, for example, 2.6 or less are provided on a semiconductor substrate 1. The interlayer insulating film 143 can be a porous film consisting of, for example, polymethylsiloxane (relative dielectric constant=2.3) or polyarylene hydrocarbon (dielectric constant=2.2). Alternatively, the interlayer insulating film 143 may be a multi-layered film comprising two or more insulating films, at least one of which has dielectric constant of 2.6 or less. In this case, the uppermost film may be covered with a silicon oxide film or silicon nitride film formed by, for example, plasma CVD. The film 143 shown in FIG. 47 comprises two films 143*a* and 143*b,* the latter formed on the former. A wiring layer 141 is provided in the interlayer insulating film 143.

Another interlayer insulating film 143, or upper interlayer insulating film, is provided on the interlayer insulating film 143. A wiring layer 142 is provided in the upper interlayer insulting film 143. Plugs 161 connect the wiring layer 141 and 142.

An interlayer insulating film 146 is provided on the upper interlayer-insulating film 143. The film 146 has dielectric constant of, for example, 3.4 or less. The film 146 can be consisting of, for example, polymethylsiloxane. Alternatively, the film 146 may be an organic insulating film, a hydrogen silsesquioxane film, a carbon-containing $SiO_2$ film, a porous silica film, or a macromolecular film. Otherwise, the film 146 may be a multi-layered one that includes one or more of these films. If this is the case, the uppermost layer may be covered with a silicon oxide film or silicon nitride film formed by, for example, plasma CVD. A wiring layer 144 is provided in the interlayer insulating film 146. Plugs 162 connect the wiring layer 144 to the wiring layer 142 provided in the upper interlayer-insulating film 143.

Another interlayer insulating film 146, or upper interlayer insulating film, is provided on the interlayer insulating layer 146, or lower interlayer insulating film. A wiring layer 145 is provided in the upper interlayer insulating film 146. A plug 163 connects the wiring layer 145 to the wiring layer 144 that is provided in the lower interlayer insulating film 146.

An interlayer insulating film having dielectric constant of, for example, 3.5 or more is provided on the lower interlayer insulating film 146. A wiring layer 147 is formed in the interlayer insulating film 148. A plug 164 connects the wiring layer 147 to the wiring layer 145 that is provided in the upper interlayer insulating film 146.

A protective film 149*a* is provided on the interlayer insulting film 148. A protective film 149*b* is provided on the protective film 148*a*. The protective films 149*a* and 149*b* consist of silicon nitride and silicon oxide, respectively. The films 149*a* and 149*b* constitute a protective film 149.

A pad 150 is formed on the protective film 149*b*. The pad 150 has a part that fills an opening made in the protective film 149. The pad 150 is therefore electrically connected to the wiring layer 147. Alternatively, the pad 150 may be connected to the wiring layer 147 by a plug made in the protective films 149. A protective film 151*a* is provided on the protective film 149. A protective film 151*b* is provided on the protective film 151*a*. The films 151*a* and 151*b* consist of, for example, silicon nitride and silicon oxide, respectively, and constitute a protective film 151. The protective film 151 has an opening, which exposes the pad 150.

Reinforcing members 132*a,* each having via fences, are provided in those parts of the interlayer insulating films 143 and interlayer insulating films 146 in which no wiring layers are formed at all. The reinforcing members 132*a* may surround the wiring layers 141, 142, 144 and 145, spaced from these layers by a distance of, for example, 1.2 μm. Alternatively, only some of the reinforcing members 132*a* may surround some of the wiring layers. Otherwise, each reinforcing member 132*a* may surround a wiring layer and may extend as much as possible in that part of the interlayer insulting film in which no wiring layer is formed.

The structure of FIG. 47 is provided in the chip region, i.e., semiconductor chip 51, which is surrounded by a fence (chip ring) 52 of the type illustrated in FIGS. 2 and 3. The same holds true of the structures of FIGS. 48 and 49, which will be described later.

The tenth embodiment can be identical to the ninth embodiment in terms of the width of the reinforcing wiring layers 133 of the reinforcing member 132*a,* the width of the reinforcing fences 134 of the reinforcing member 132*a* and the coverage of the member 132*a* on the reinforcing-member region 131. Nonetheless, like the ninth embodiment, the advantage brought by the reinforcing member 132*a* is most significant if the wiring layers 133 have a width of 0.3 μm, the via fences 134 have a width of 0.1 μm and the coverage is 40%. In this case, the square openings of the mesh-like structure composed of the wiring layers 133 have a size of, for example, 1.03 μm×1.03 μm.

To demonstrate the advantage that the reinforcing member 132*a* achieves, four tests identical to those carried out for the eighth embodiment were conducted on samples of the tenth embodiment. Each sample comprises wiring layers 133 having a width of 0.3 μm, reinforcing via fences 134 having a width of 0.1 μm, and a reinforcing member 132*a* that covers 40% of the reinforcing-member region 131. The four tests showed that none of the samples were undesirable.

The embodiments described above comprise a reinforcing member 132*a* which has via fences and which is provided in the interlayer insulating films 143 and 146. The present invention is not limited to the embodiments. A reinforcing member 132*a* with via fences may be provided in the interlayer insulating film 143 that has low-k, and either a reinforcing member 132*a* without via fences or a reinforcing member 132*b* with via plugs may be provided in the interlayer insulating film 146 that has high dielectric constant. A reinforcing member 132*a* with via fences may be provided in the interlayer insulating film 148 that is made not mainly of high-dielectric constant material.

The width of the wiring layers 133 and the coverage of the member 132*a* on the region 131 may be changed in accordance with the relative dielectric constants of the interlayer insulating films. Then, the wiring layers 133 provided in the interlayer insulating films 146 can be broader than the wiring layers 133 provided in the interlayer insulating films 143, and the coverage of the member 132*a* provided in the interlayer insulating film 146 can be smaller than that of the reinforcing members 132*a* provided in the interlayer insulating films 143.

As FIG. 48 shows, the reinforcing member 132*a* with via fences may comprise two parts 132-1 and 132-2. The first part 132-1 surrounds the wiring layers 141, 142, 144 and 145 and lies beneath the pad 150. The second part 132-2 is electrically disconnected from the first part 132-1. That portion of the first pat 132-1, which does not lie below the pad 150 need not have via fences.

Figure 49:
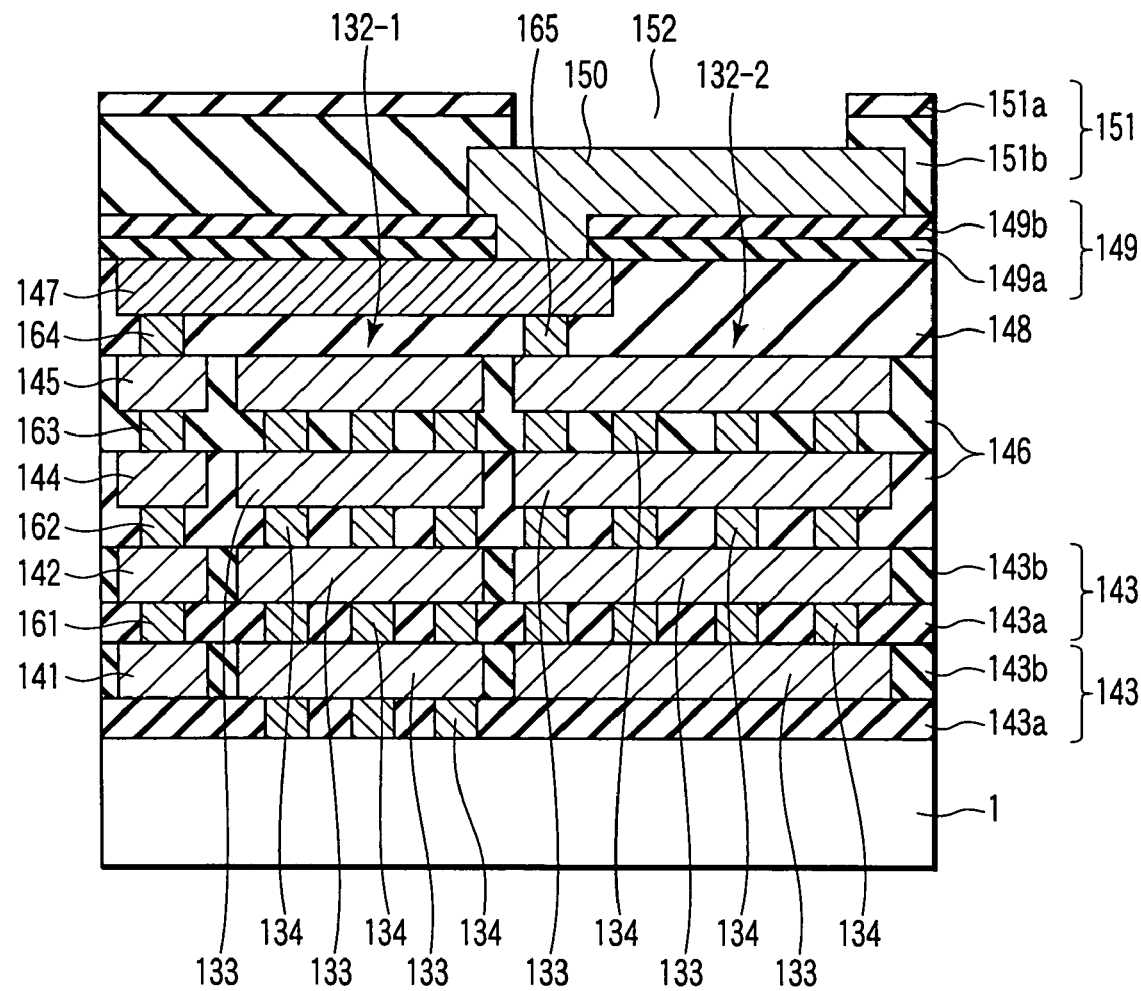

As FIG. 49 depicts, that portion of the first part 132-2, which lies below the pad 150, may be electrically connected to the wiring layer 147 by the plugs 161. In this case, the lowermost via fence 134 of the second part 132-2 of the reinforcing member 132*a* is not provided at all, electrically disconnecting the second part 132-2 from the semiconductor substrate 1. As a result, the second part 132-2 is at the same potential as the wiring layer 147. Thus, no short-circuiting would take place if dielectric breakdown should occur at the time of probing or bonding.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate having a main surface;
a first insulating layer provided above the main surface, including one or more sub-layers and including conductive first wirings and conductive first plugs, one of the sub-layers having a relative dielectric constant smaller than 3, plural first wirings being on top of respective first plugs;
a conductive chip protecting member provided in the first insulating layer, extending between a bottom and a top of the first insulating layer and having a projected shape on the main surface that surrounds a chip region;
functional blocks provided in the first insulating layer in the chip region, having at least part of an electrical circuit and formed with using one or more of the first wirings and one or more of the first plugs; and
a conductive block protecting member provided in the first insulating layer in the chip region and including a first part and a second part, the first part having a bottom level with the bottom of the first insulating layer and a top level with a top of each of the first plugs, the second part having a bottom level with a bottom of each of the first wirings and a top level with the top of the first insulating layer and lying on and along the first part, the block protecting member having a projected shape on the main surface that surrounds one of the functional blocks.

2. The device according to claim 1, further comprising additional block protecting members that are identical to the block protecting member and each of which has a projected shape on the main surface that surrounds a respective other one of the functional blocks.

3. The device according to claim 1, further comprising a second insulating layer provided on the first insulating layer, and wherein
the second insulating layer includes conductive second plugs and conductive second wirings, plural second wirings being on top of respective second plugs,
the block protecting member further includes a third part and a fourth part,
the third part has a bottom level with a bottom of the second insulating layer and a top level with a top of each of the second plugs and lies on and along the second part, and
the fourth part has a bottom level with a bottom of each of the second wirings and a top level with a top of the second insulating layer and lies on and along the third part.

4. The device according to claim 1, further comprising:
a second insulating layer provided above the first insulating layer and having a relative dielectric constant larger than 3; and
a connecting wiring provided in the second insulating layer and electrically connecting an electrical circuit provided in a first one of the functional blocks and an electrical circuit provided in a second one of the functional blocks.

5. The device according to claim 1, wherein the projected shape of the block protecting member has an opening.

6. The device according to claim 1, wherein
an electrical circuit provided in a first one of the functional blocks and an electrical circuit provided in a second one of the functional blocks are electrically connected by a connecting wiring that is provided in the first insulating layer, and
the block protecting member extends along the connecting wiring and edges of a first one and a second one of the functional blocks so that the projected shape of the block protecting member on the main surface surrounds the connecting wiring and the first one and the second one of the functional blocks.

7. The device according to claim 1, wherein
the block protecting member extends along the main surface to partition the chip region into areas to be surrounded by the block protecting member, and
each of the functional blocks is provided in one of the areas.

8. The device according to claim 1, wherein
one of the first wirings provided in the one of the functional blocks that is surrounded by the block protecting member has a projected shape on the main surface that has a rectangular shape with a longer side and a shorter side, and
a distance between the longer side and the block protecting member is larger than a distance between the shorter side and the block protecting member.

9. The device according to claim 1, wherein the block protecting member also lies in a boundary region, which is a region between two of the functional blocks and that contains neither wirings nor plugs to form an electrical circuit.

10. The device according to claim 9, wherein the projected shape of the block protecting member on the main surface has a mesh form in the boundary region when viewed from above.

11. The device according to claim 10, wherein the mesh form of the projected shape of the block protecting member on the main surface has different shapes between its terminal near the chip protecting member and other positions.

12. The device according to claim 3, wherein
the third part has a larger cross sectional area than a cross sectional area of the first part when viewed through an imaginary plane that intersects the first and third parts, and
the fourth part has a larger cross sectional area than a cross sectional area of the second part when viewed through an imaginary plane that intersects the second and fourth parts.

13. The device according to claim 1, further comprising:
a second insulating layer on top of which the first insulating layer is provided and that includes a sub-layer having a film density of 2 or more; and
a third insulating layer provided on a top of the first insulating layer and including a sub-layer having a film density of 2 or more.

14. The device according to claim 1, wherein the one of the sub-layers that has a relative dielectric constant smaller than 3 essentially consists of a material selected from the group consisting of SiO, SiOC, SiOCN, SiN, SiCN, SiON, and SiONH.

15. The device according to claim 1, wherein the block protecting member has a fixed potential.

16. A semiconductor device comprising:
a semiconductor substrate having a main surface;
a first insulating layer provided above the main surface and including one or more sub-layers and including conductive first plugs, one of the sub-layers having a relative dielectric constant smaller than 3;

a second insulating layer provided on the first insulating layer and including conductive second plugs and wirings, plural wirings being on top of respective second plugs;

a conductive chip protecting member provided in the first and second insulating layers, extending between a bottom of the first insulating layer and a top of the second insulating layer and having a projected shape on the main surface that surrounds a chip region, the second insulating layer having an area void of the second insulating layer and that is outside the chip region and extending from the top of the second insulating layer to a bottom of the second insulating layer; and a conductive region protecting member provided in the first insulating layer, having a bottom level with the bottom of the first insulating layer and a top level with a top of the first insulating layer and having a projected shape on the main surface that surrounds a region under the area void of the second insulating layer.

17. A semiconductor device comprising:

a semiconductor substrate having a main surface;

a first insulating layer provided above the main surface, including one or more sub-layers and including conductive first wirings, one of the sub-layers having a relative dielectric constant smaller than 3;

a second insulating layer provided on the first insulating layer, including one or more sub-layers and including conductive plugs and conductive second wirings, one of the sub-layers having a relative dielectric constant smaller than 3, plural second wirings being on top of respective plugs;

a conductive chip protecting member provided in the first and second insulating layers, extending between a bottom of the first insulating layer and a top of the second insulating layer and having a projected shape on the main surface that surrounds a chip region; and a conductive reinforcing member provided in the chip region around the first wirings, plugs, and second wirings and including a first part, a second part, and a third part, the first part having a bottom level with a bottom of each of the first wirings and a top level with a top of each of the first wirings, the second part having a bottom level with a bottom of the second insulating layer and a top level with a top of the plugs, the third part having a bottom level with a bottom of each of the second wirings and a top level with the top of the second insulating layer and lying on and along the second part, the second part having a projected shape on the main surface that has a linear shape.

18. The device according to claim 17, wherein the second part lies on and along the first part.

19. The device according to claim 18, wherein a projected shape of the reinforcing member on the main surface has a mesh form.

20. The device according to claim 19, wherein the projected shape of the reinforcing member on the main surface occupies 20 to 80% of an area of the main surface between functional blocks.

21. The device according to claim 19, wherein the projected shape of the reinforcing member on the main surface occupies 30 to 60% of an area of the main surface between functional blocks.

22. The device according to claim 18, wherein a projected shape of each of the first part and third part on the main surface has a width of at most 5 µm.

23. The device according to claim 18, wherein a projected shape of each of the first part and third part on the main surface has a width of at most 1 µm.

24. The device according to claim 18, wherein a projected shape of the second part on the main surface has a width of at least 30% of a width of a projected shape of the first part or the third part on the main surface.

25. The device according to claim 18, wherein a projected shape of the second part on the main surface has a width of at least 50% of a width of a projected shape of the first part or the third part on the main surface.

26. The device according to claim 18, wherein a projected shape of the third part on the main surface has a larger width than a projected shape of the first part on the main surface.

27. The device according to claim 18, wherein a projected shape of the third part on the main surface occupies a greater area of the main surface than a projected shape of the first part on the main surface.

28. The device according to claim 18, further comprising a pad provided above the first insulating layer and electrically connected to one of the first wirings, wherein the reinforcing member includes a discrete first portion and second portion, and the first portion is located below the pad and is electrically connected to the pad.

29. The device according to claim 17, wherein the reinforcing member lies around one of the first wirings and extends in a direction that crosses a direction in which the one of the first wirings extends.

30. The device according to claim 17, wherein the reinforcing member further includes a fourth part that has a bottom level with the bottom of the first wirings and a top level with a top of the first wirings, and the second and third parts are provided above the region between the first part and the fourth part.

* * * * *